(12) United States Patent
Nguyen et al.

(10) Patent No.: US 10,080,304 B1
(45) Date of Patent: Sep. 18, 2018

(54) FUNCTIONAL ELECTROMAGNETIC INTERFERENCE CONTAINMENT ASSEMBLY FOR PLUGGING ENCLOSURE OPENINGS

(71) Applicant: Oracle International Corporation, Redwood City, CA (US)

(72) Inventors: Khanh Huy Nguyen, Manchester, NH (US); Eric Munro Innes, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/661,590

(22) Filed: Jul. 27, 2017

(51) Int. Cl.
| | |
|---|---|
| *H05K 7/20* | (2006.01) |
| *H05K 7/14* | (2006.01) |
| *H05K 9/00* | (2006.01) |
| *H05K 1/18* | (2006.01) |
| *H01H 13/14* | (2006.01) |
| *H01H 13/50* | (2006.01) |
| *F21V 3/02* | (2006.01) |
| *H05K 5/00* | (2006.01) |
| *F21Y 115/10* | (2016.01) |

(52) U.S. Cl.
CPC ............ *H05K 7/1488* (2013.01); *F21V 3/02* (2013.01); *H01H 13/14* (2013.01); *H01H 13/50* (2013.01); *H05K 1/181* (2013.01); *H05K 9/0018* (2013.01); *H05K 9/0022* (2013.01); *F21Y 2115/10* (2016.08); *H05K 5/0017* (2013.01); *H05K 2201/10053* (2013.01); *H05K 2201/10106* (2013.01)

(58) Field of Classification Search
CPC ............ G06F 3/00; G06F 3/02; H01H 13/702
See application file for complete search history.

(56) References Cited

U.S. PATENT DOCUMENTS

| | | | | |
|---|---|---|---|---|
| 3,777,222 | A * | 12/1973 | Harris | G06F 3/0488 200/314 |
| 4,060,703 | A * | 11/1977 | Everett, Jr. | H01H 13/83 200/275 |
| 6,028,591 | A * | 2/2000 | Lueders | G06F 3/0238 345/104 |

(Continued)

*Primary Examiner* — Anthony Q Edwards
(74) *Attorney, Agent, or Firm* — Marsh Fischmann & Breyfogle LLP; Kent A. Lembke; Daniel J. Sherwinter

(57) ABSTRACT

A functional EMI containment plug or assembly useful to block an opening or hole in an electronics cabinet or enclosure so as to provide EMI containment. Functionality is achieved by combining a membrane with a circuit board. The EMC assembly functions as a circuit board-based membrane keyboard, which includes tactile switches a user can press to actuate a circuit board function. The switches may be a dome switch that has collapsing action (e.g., amount of travel), and the thickness of the membrane layers placed on top of the front of the circuit board are matched to the chosen dome switch to allow a proper amount of travel. The layers of the membrane act as an EMI shield. In one embodiment, the membrane includes a metal foil layer and a conductive material layer, and the combination of foil and conductive layers of the membrane act to provide a shield for EMI.

25 Claims, 22 Drawing Sheets

(56) References Cited

U.S. PATENT DOCUMENTS

| | | | | |
|---|---|---|---|---|
| 6,185,108 B1 * | 2/2001 | Okura | ............... | H01H 13/702 |
| | | | | 174/377 |
| 6,680,853 B1 * | 1/2004 | Dobbs | ................ | H05K 3/301 |
| | | | | 361/717 |
| 2012/0201011 A1 * | 8/2012 | Finley | ............... | H05K 9/0005 |
| | | | | 361/818 |

* cited by examiner

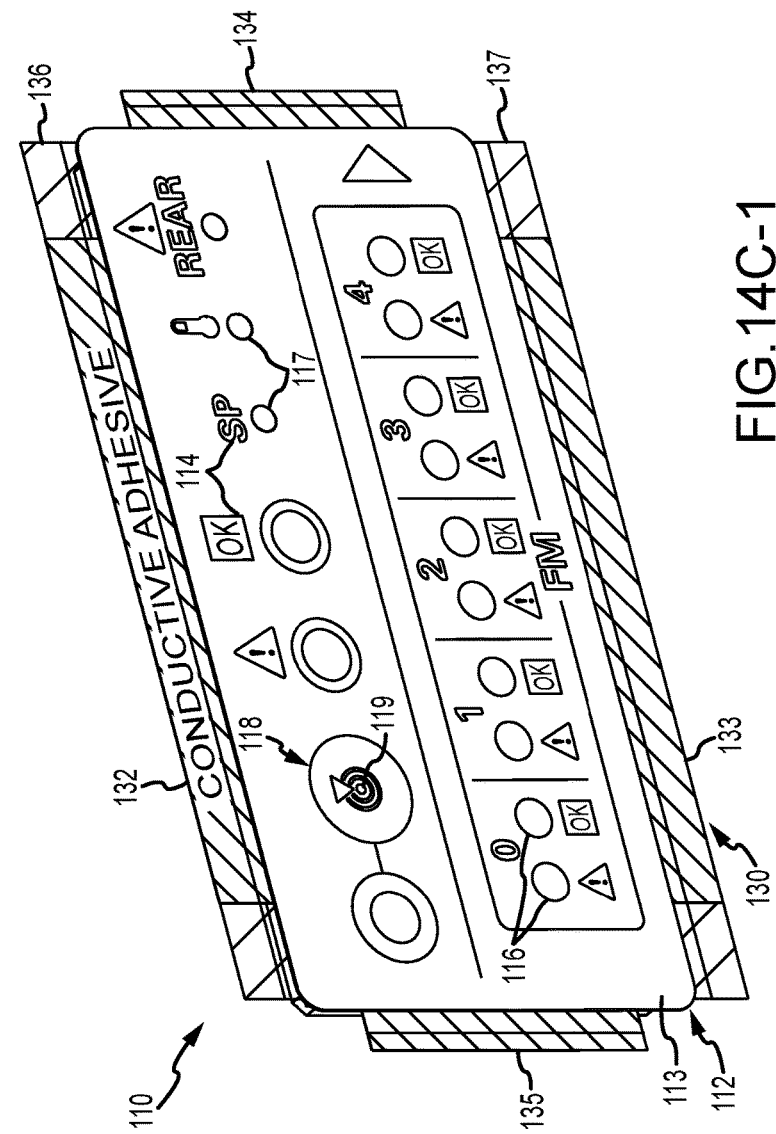

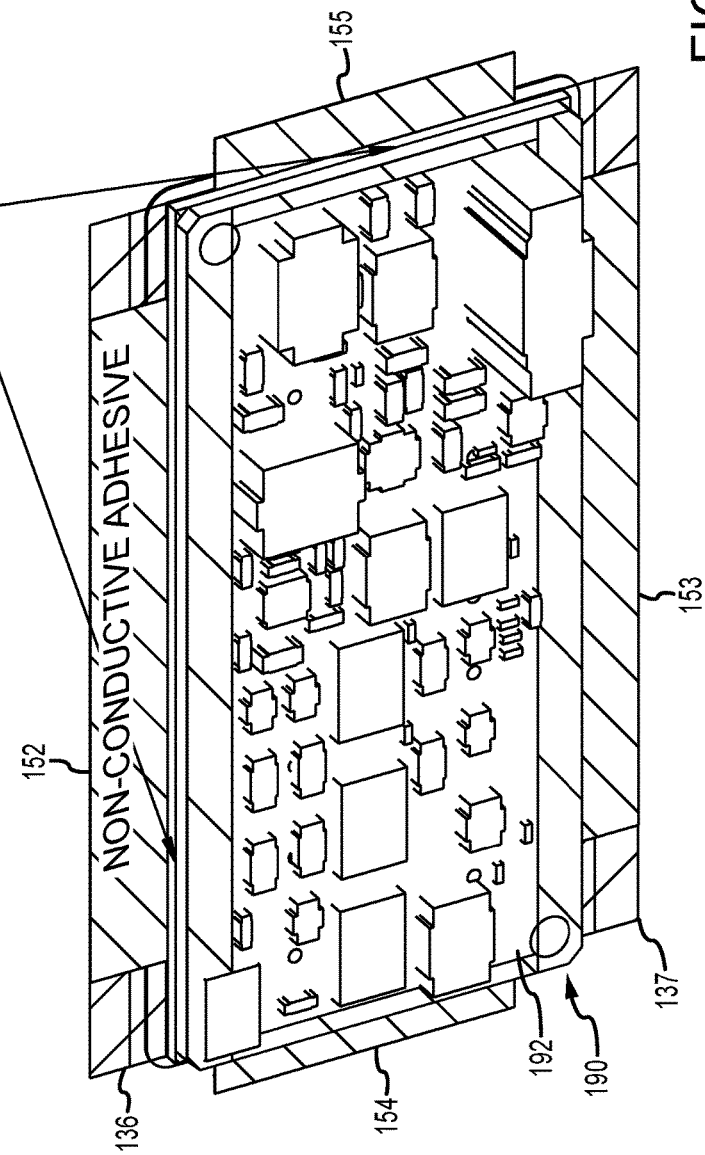

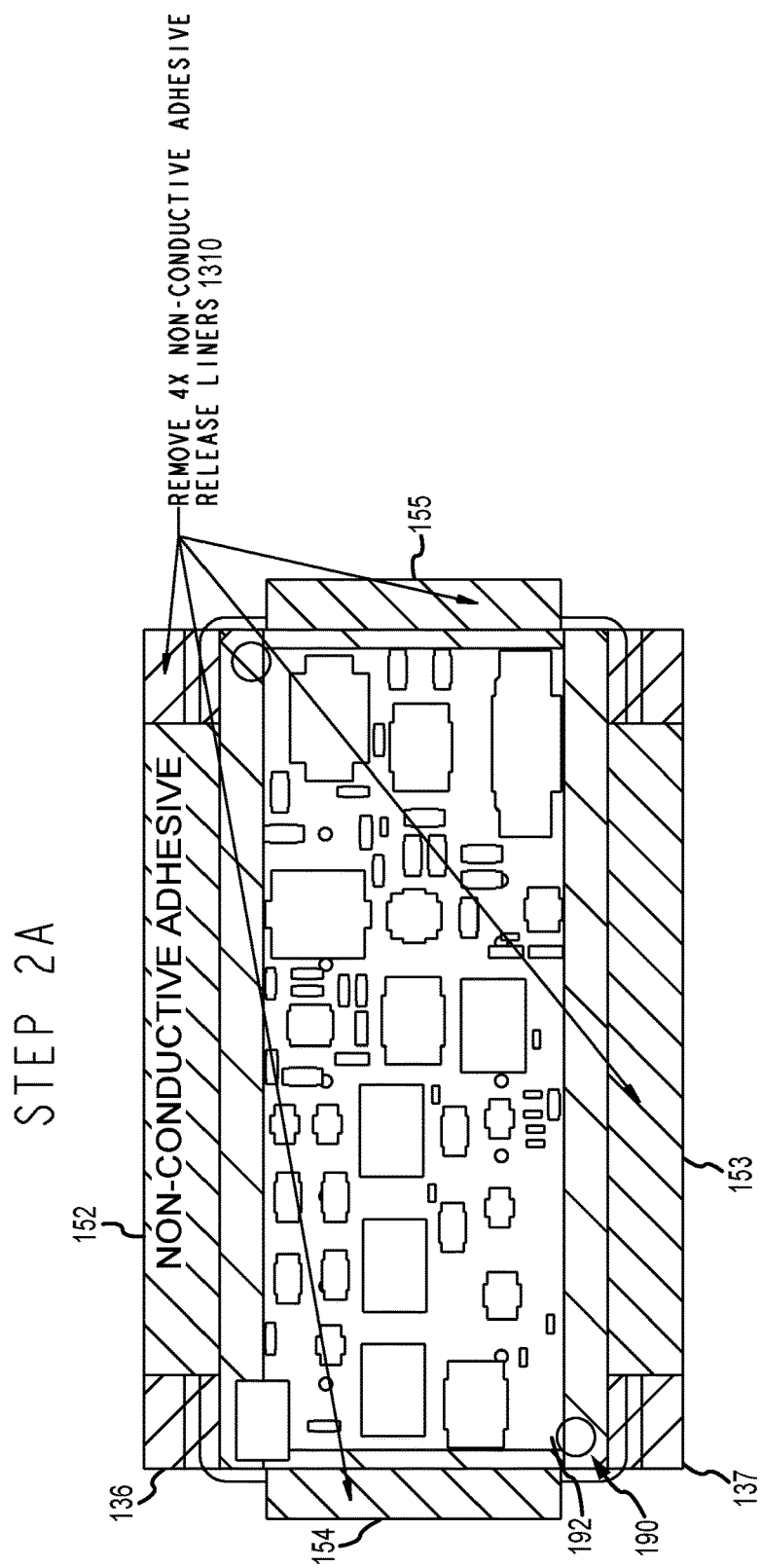

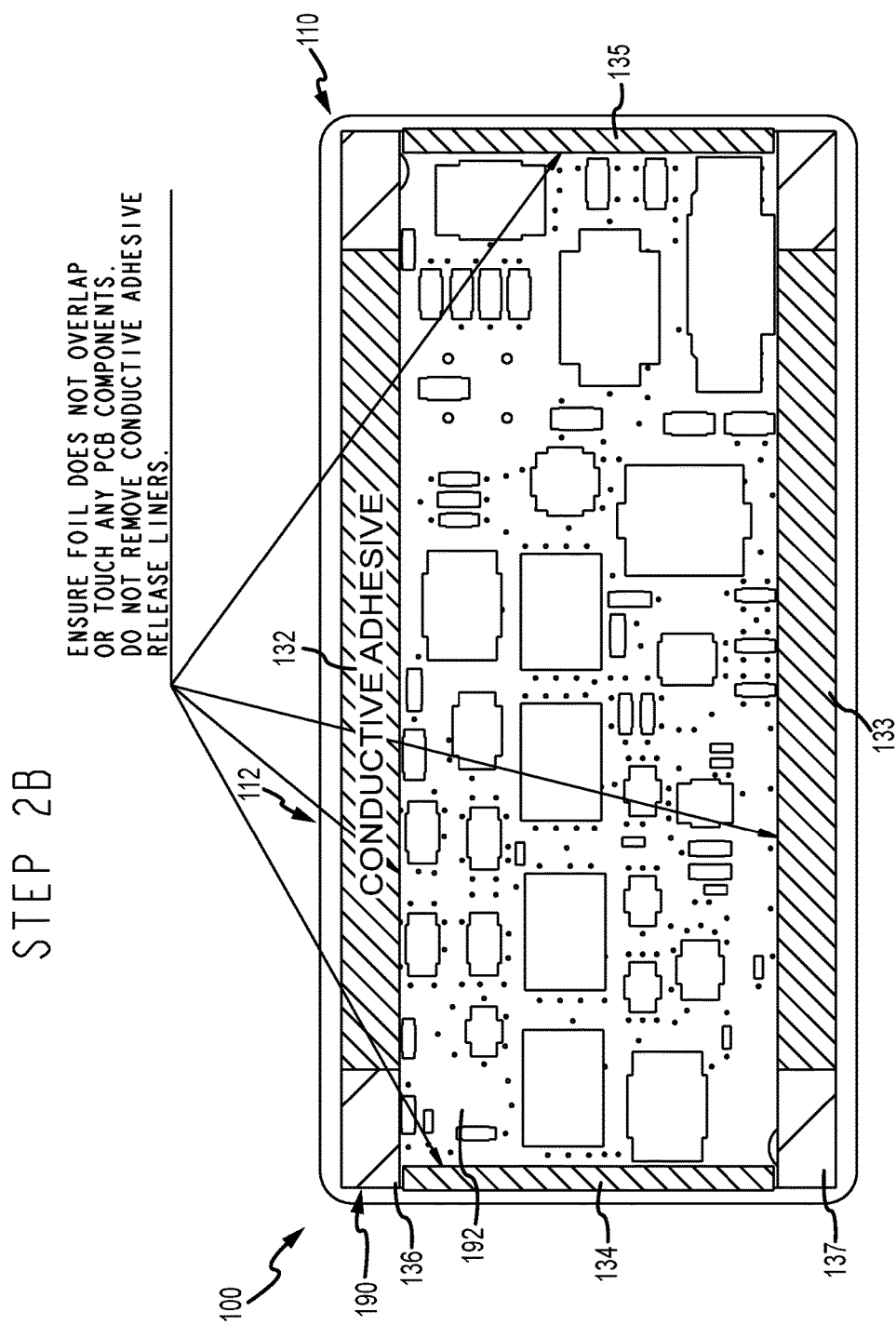

US 10,080,304 B1

FUNCTIONAL ELECTROMAGNETIC INTERFERENCE CONTAINMENT ASSEMBLY FOR PLUGGING ENCLOSURE OPENINGS

BACKGROUND

1. Field of the Invention

The present description generally relates to enclosures, such as cabinets, racks, and the like, used for mounting and enclosing servers and other computer equipment, telecommunications equipment, and electronics. More particularly, the present description relates to an assembly (or "plug") for use in plugging or sealing a hole or opening in an enclosure so as to provide EMI containment (EMC) while also being functional, and the assembly or plug may be considered a functional EMC assembly or plug.

2. Relevant Background

There are numerous settings or environments where electronic equipment, computers and computer equipment (e.g., servers, routers, and so on), and telecommunications equipment are provided in a centralized location in standard or conventional enclosures such as racks and cabinets. Often, this equipment is provided within a box or chassis that is then mounted within the enclosure. Such use of enclosures with configurable electronic or computer devices can be found in data centers, computer rooms, network rooms, control rooms, telecommunication centers, and so on. In some cases, the enclosures will have one or more holes or openings in an exposed sidewall, and there is a need to plug or block this opening so as to provide shielding or containment of electromagnetic interference (EMI).

The damaging effects of EMI pose unacceptable risks in many areas of technology, and it is necessary to control EMI to reduce the risks to acceptable levels. Specifically, due to the proximity of the various electronics operating within and nearby to enclosures in which the electronics are mounted, EMI must be contained to ensure that the operation of one device within one system or one enclosure does not affect the operation of another device within the same or another enclosure. Providing EMI shielding or containment for each opening in an enclosure would be a relatively straightforward problem. However, it is also desirable for the plug or shield to be functional, and this demand for a functional EMI plug has led to a number of design issues and challenges.

SUMMARY

Briefly, the inventors created a functional EMI containment plug or assembly (or EMC plug or assembly) that is useful in nearly any application where it is desired to plug or block an opening or hole in an electronics cabinet or enclosure (such as in a server rack/enclosure or the like) so as to provide EMI control or containment. The new EMC assembly is relatively simple and inexpensive to manufacture and requires only a small amount of time to install.

Functionality is achieved by combining a membrane with a printed circuit board (PCB) or PCB with other electronic components in the form of a printed circuit assembly (PCA) (herein, both are referred to more simply as "boards" or "circuit boards"). The EMC assembly functions or acts as a circuit board-based membrane keyboard, which includes tactile switches a user can press to actuate a PCA function. One or more of the switches may take the form of a dome switch that has collapsing action (e.g., amount of travel), and the thickness of the layers of the membrane placed on top of the front of the circuit board is matched to the chosen dome switch to allow a proper amount of travel.

The layers of the membrane may also be configured to improve visibility of light emitted from lights (e.g., light emitting diodes (LEDs)) on the circuit board. This may include providing an air gap between the LEDs on the circuit board (e.g., a PCA) and the first layer of the membrane because this air gap provides more uniform spreading of the emitted light onto the membrane's first layer (i.e., the observable or outer layer of the membrane) and desirably avoids providing a simple pin point of light.

The materials chosen for the layers of the membrane also allow the membrane to act as an EMI shield and/or to provide EMI containment. In one embodiment, the membrane includes a metal foil layer that lays behind or abuts an adjacent layer that is formed of a conductive material such as a conductive adhesive. The combination of the foil and conductive layers of the membrane acts to provide a shield or plug for EMI.

More particularly, an apparatus is provided that is adapted specifically for mounting over an opening in an electronics enclosure to provide electromagnetic interference (EMI) containment and other functionality. The apparatus includes a circuit board with a function-triggering button on a front side. The apparatus also includes a membrane attached to and covering the front side of the circuit board. The membrane has a plurality of layers including an inner layer formed of an adhesive material abutting the front side of the circuit board and an outer layer formed of a clear material with a first side facing away from the circuit board and a second side facing toward the circuit board. The plurality of layers includes a foil layer positioned between the inner layer and the outer layer, and the foil layer includes a body formed of a metal foil that is sized and shaped to extend over the front side of the circuit board. The membrane further includes a linear-actuated switch abutting the second side of the outer layer and extending through a switch passageway provided through the inner layer and the foil layer, whereby the function-triggering button is activated when the linear-actuated switch is moved linearly through a predefined amount of travel.

In some embodiments, the metal foil is a sheet or film of aluminum foil, and the body of the foil layer extends over the front side of the circuit board. The foil layer may further include four tabs extending outward from sides of the body, and each of the tabs (or wings) extends over an edge of the circuit board and abuts (or covers) a portion of a back side of the circuit board opposite the front side of the circuit board. The plurality or set of layers further may include a layer of conductive adhesive positioned between the foil layer and the outer layer, and this layer of conductive adhesive includes a hole aligned with the switch passageway to allow the linear-actuated switch to pass through the layer of conductive adhesive. Also, the layer of conductive adhesive may include four tabs or wings extending outward from a central body to cover each of the tabs of the foil layer on the back side of the circuit board.

In the same or other embodiments of the apparatus, the first side of the outer layer of the membrane may include a domed switch element extending outward from the circuit board a distance and with a center aligned with a center of the linearly-actuated switch. The plurality of layers may then have a thickness when combined with the distance that matches the predefined amount of travel. In such cases, the linearly-actuated switch may take the form of a dome switch.

The membrane may be configured to enhance visibility of LEDs or other lights/light sources on the circuit board. To this end, openings or holes can be provided in the inner layer and the foil layer to define a plurality of light passageways. The first side of the outer layer may include a plurality of domed lens elements each aligned with one of the light passageways. Further, the circuit board may then include a light source (e.g., an LED or the like) on the front side aligned with each of the light passageways, whereby light from each light source is passed through the plurality of layers via the light passageways and is diffused at a viewing angle of at least 30 degrees by one of the domed lens elements.

BRIEF DESCRIPTION OF THE DRAWINGS

FIGS. 14A-14C3 illustrate initial steps for assembling the functional EMC assembly of FIGS. 1 and 2; and FIGS. 15A-15B2 illustrate final steps for assembling the functional EMC assembly of FIGS. 1 and 2.

DETAILED DESCRIPTION

The present description is directed toward an assembly for containing EMI from escaping (or providing an EMI plug for) a hole or opening in any enclosure in which EMI may be generated or an issue such as, but not limited to, a computer system enclosure. Additionally, the assembly is functional and not just an EMI shield. Hence, the assembly may be labeled or thought of as a functional EMI containment (EMC) assembly.

Briefly, the functional EMC assembly combines a circuit board (such as a PCA or the like) with a membrane, and the membrane is fabricated or constructed of a plurality of layers. The layers are chosen to provide EMI containment or control and also to allow the assembly to efficiently and effectively act a circuit board-based membrane keyboard once installed to plug or cover an opening or hole in an enclosure. The membrane is configured to fully encase the circuit board (e.g., a PCA) and acts as a mechanical switch for the circuit board, an EMI containment, and an environmental containment for the circuit board. By providing an assembly including a circuit board and a membrane that is fully wrapped around the circuit board, the EMC assembly offers the following solutions: (a) reduction of surface-mount technology (SMT) components on the circuit board, which is made possible with use of a cost-effective membrane with an integrated tactile or mechanical switch (such as a dome switch); (b) integration of control panel switches, indicators, and graphics into a single part or assembly; and (c) provision of EMI shielding (e.g., to the wrapped or underlying circuit board).

The concept of a functional EMC assembly is an improvement for a number of reasons. First, the concept of a membrane laying over a circuit board (e.g., a PCA or the like) and not adversely affecting circuit board signals is an improvement. The improvement is made possible by the use of a "spacer material" that creates a non-conductive barrier between the circuit board along with a shielding foil layer (e.g., an aluminum foil layer) integrated into the membrane. The combination of these two features allows for: (a) static discharge on the membrane is blocked from passing through and onto the circuit board; and (b) EMI containment is provided for the circuit board of the functional EMC assembly as well as any other inboard circuit boards or devices in the enclosure upon which the assembly is mounted. Second, traditional membrane indicators have a flat surface. The membrane described herein uses a domed surface or lens element over one or more of the indicators of the circuit board to improve the viewing angle (e.g., to a 30 degree or greater viewing angle such as in the range of 30 to 45 degrees or more). Specific dome surface or lens element are determined and used for a combination of board lights (e.g., LEDs) and membrane "spacer" (or spacer layer(s)) thicknesses.

Figure 1:
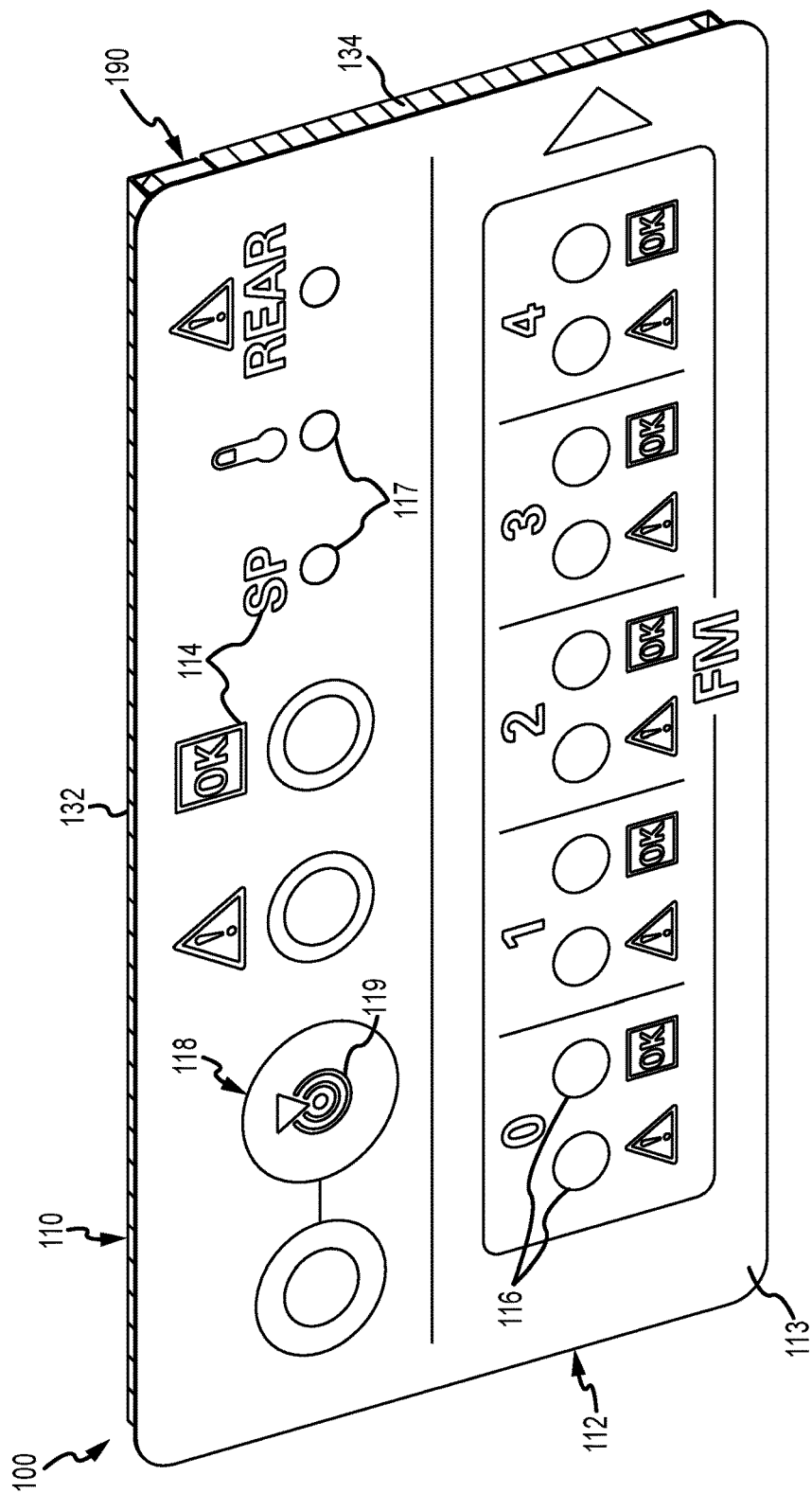
FIG. 1 illustrates a front perspective view of a functional EMC assembly of the present description prior to its mounting upon an enclosure to cover or plug an opening or hole in the enclosure.
Figure 2:
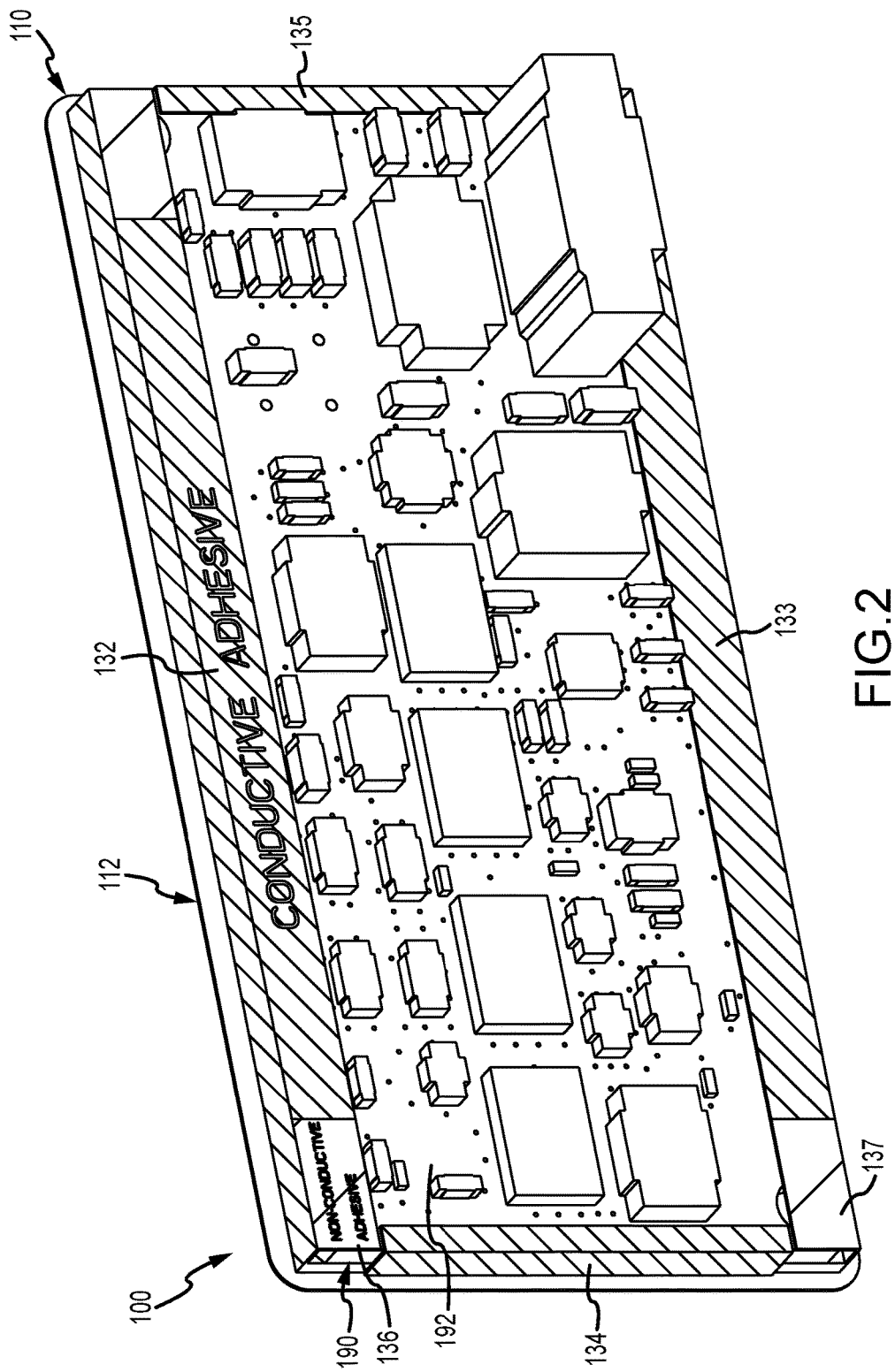
FIG. 2 illustrates a rear perspective view of the functional EMC assembly of FIG. 1.

FIG. 1 illustrates a front perspective view of a functional EMC assembly 100 of the present description prior to its mounting upon an enclosure to cover or plug an opening or hole in the enclosure. This provides EMI containment for the enclosure and also provides a functional plug or cover for the plug/cover rather than a mere EMI shield, and additional EMI shielding is not required for the components of the functional EMC assembly 100. FIG. 2 illustrates a rear perspective view of the functional EMC assembly 100 of FIG. 1.

As shown, the assembly 100 includes a circuit board 190 such as a PCA or the like, and FIG. 2 illustrates the back surface or side 192 of the circuit board 190 that would face inward into an enclosure once the assembly 100 is mounted as an EMI containment plug/shield for enclosure. The functional EMC assembly 100 is formed of a membrane 110 and the circuit board 190. The membrane 110 that is applied over or wrapped about the circuit board 190 so as to cover the front surface/side of the circuit board 190 and also to cover or extend over the ends/edges of the circuit board 190 to be applied onto at least portions of the back surface/side 192.

As shown in FIG. 2, a layer of the membrane includes top and bottom wings or tabs that are formed of a central portion 132, 133 that is formed of a conductive adhesive while the ends or corners 136, 137 of the wings are each formed of non-conductive adhesive, and the top and bottom wings are wrapped over the entire length of the top and bottom ends/edges of the circuit board 190 and extend over a portion of the back surface 192 of the circuit board 190. Further, this layer of the membrane includes side wings 134, 135 formed of the conductive adhesive, that wrap around the side end/edges of the circuit board 190 and extend over a portion of the back surface/side 192 of the circuit board 190. As explained below, the conductive adhesive of this layer of the membrane combined with a metal foil layer act as an EMI shield for the assembly 100, and the effectiveness of this shielding is enhanced by having the wings of this layer wrapping around the ends/edges of the circuit board 190 as well as covering the front surface/side of the circuit board 190.

As shown in FIG. 1, the membrane 110 is configured to wholly cover the front side or surface of the circuit board 190 with the wings 132, 134 extending over the ends/edges of the circuit board 190. The membrane 110 includes a first or outer layer 112 that is visible with the assembly 100 installed upon an enclosure. The assembly 100 is "functional" in that it can act as a circuit board-based membrane keyboard. To this end, the first or outer layer 112 of the membrane 110 includes an outward facing first side 113 that includes a number of visual or graphical components 114 such as labels, icons, textual items, and the like to assist a user in operating the assembly 100.

Further, the first or outer layer 112 includes a number of domed or lens elements 116 and 117 on surface 113 that are formed so as to enhance the diffusion or projection of light from underlying lights (e.g., LEDs) on the front side of the circuit board 190, and the domed/lens elements 116 and 117 may be formed of a clear or translucent material and may be sized and shaped (e.g., with a diameter and height) to achieve a desired lighting effect. Still further, function is achieved in the assembly 100 by providing a tactile switch 118 that may include a domed element combined with a linear-actuated switch provided in the membrane that is activated by a user pressing on the center 119 of the domed element. The height of the domed element of the switch 118 along with the travel provided by the combined thicknesses of the layers of the membrane 110 allows the linear-actuated switch (e.g., a dome switch) to have an appropriate amount of travel to interact with a contact activated element on a front surface of the circuit board 190.

Figure 3:
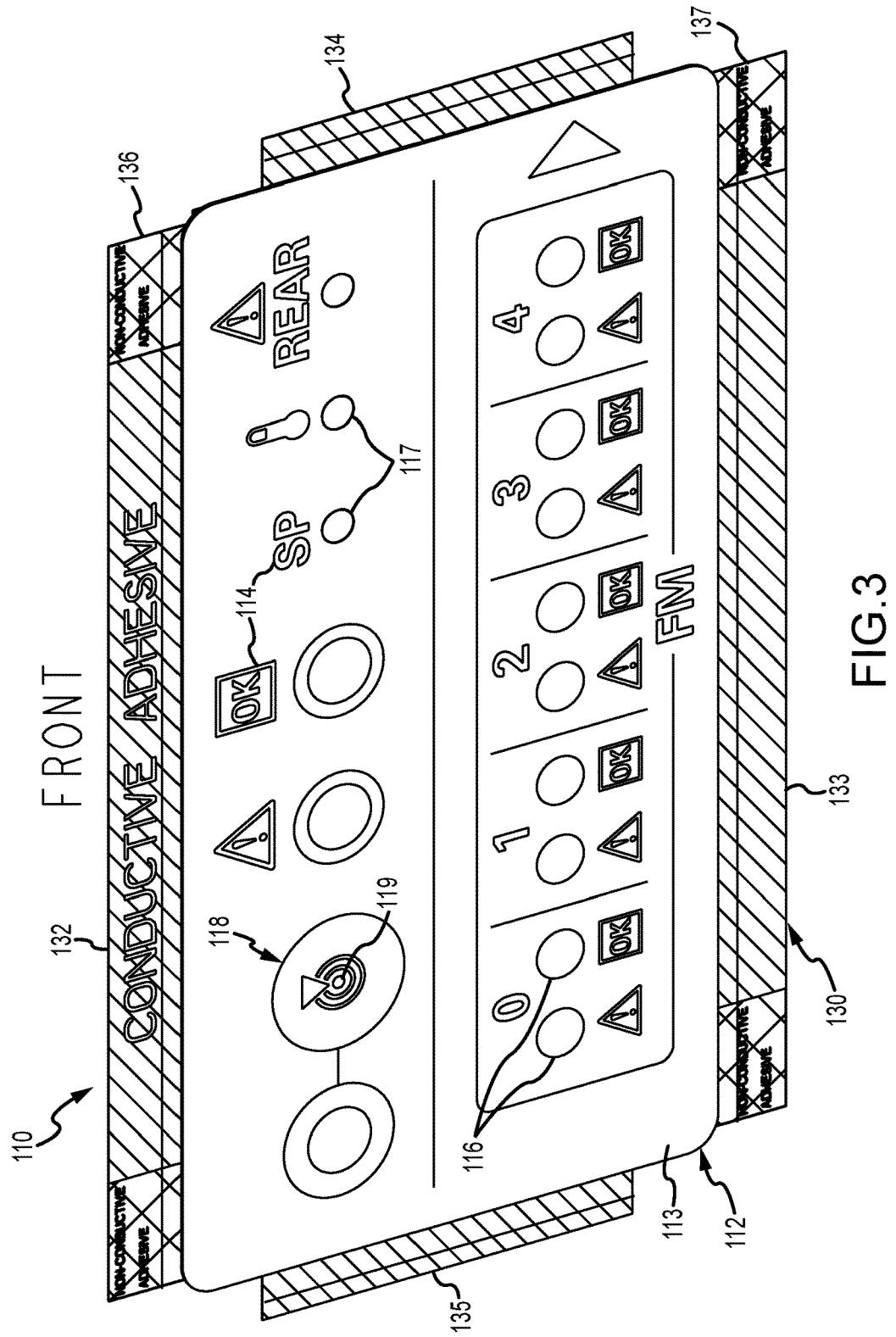
FIGS. 3 and 4 illustrate front and rear perspective views, respectively, of the assembled (or fabricated) membrane of the functional EMC assembly of FIGS. 1 and 2 prior to application onto a circuit board.
Figure 4:
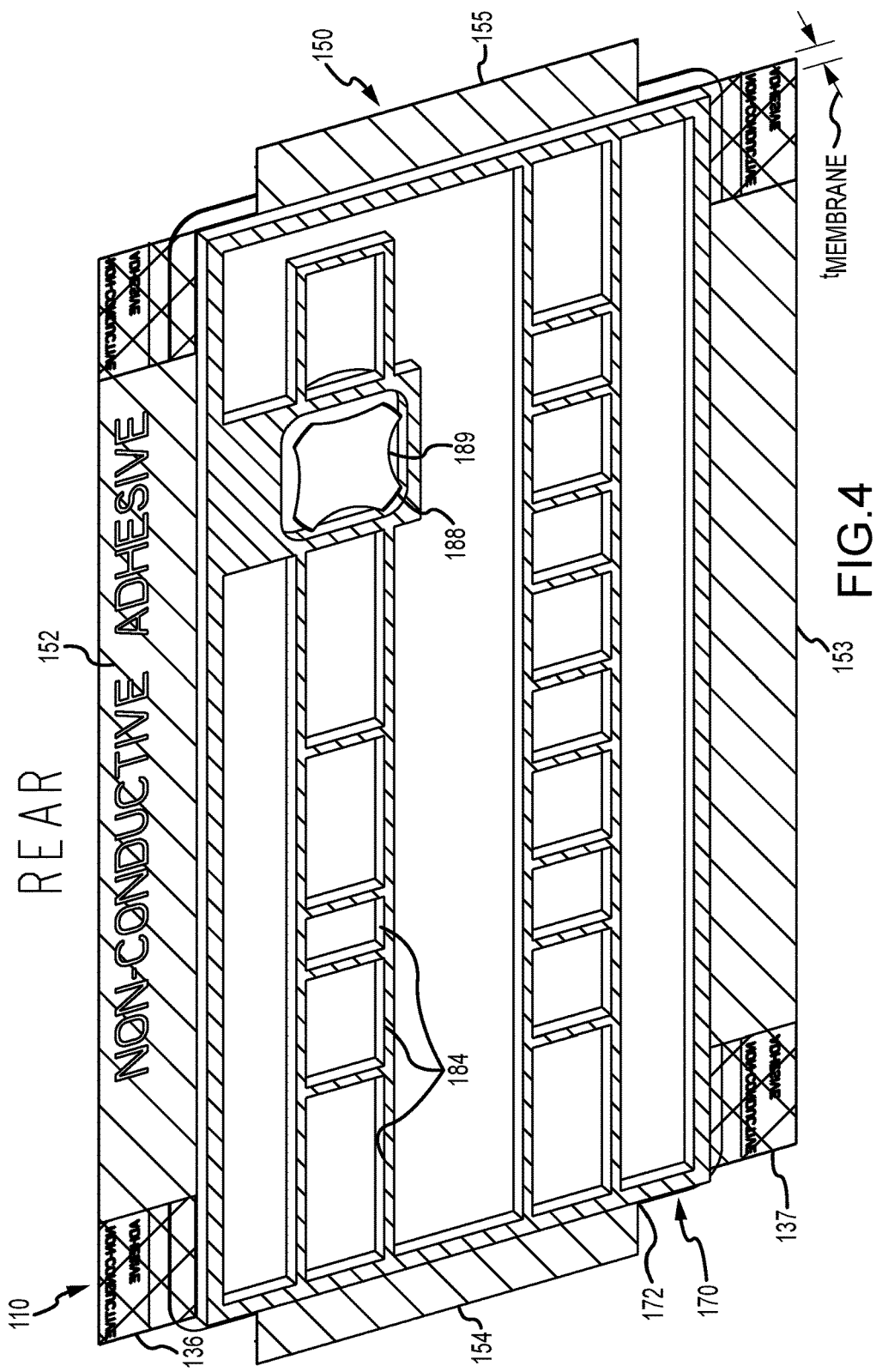

With this general understanding of the EMC assembly 100 understood, it may be useful to next describe the membrane 110 in detail including the specific design of each of its layers and then turn the description toward the process used for assembling the membrane 110 and the circuit board 190 to form the EMC assembly 100. FIGS. 3 and 4 illustrate front and rear perspective views, respectfully, of the assembled (or fabricated) membrane 110 of the functional EMC assembly 100 of FIGS. 1 and 2 prior to application onto the circuit board 190. As shown in FIG. 3, the first or outer layer 112 of the membrane 110 has its first side 113 facing outward (or away from the other layers of the membrane 110), with the features discussed with reference to FIG. 1 including the graphical/visual elements 114, the domed or lens elements 116, 117, and a domed or embossed outer portion 118 of a tactile switch.

The membrane 110 is formed with a plurality of layers in addition to the first or outer layer 112. Specifically, the membrane 110 includes a third layer 130 in the form of a layer or thickness of conductive adhesive with upper and lower wings/tabs 132, 133 and right and left side wings/tabs 134, 135 combined with corners formed of non-conductive adhesive 136, 137 (representing two of the four corners of non-conductive adhesive material). Additionally, as shown more clearly in FIG. 4, the membrane 110 further includes in inner or ninth layer 170 with a body 172 formed of non-conductive adhesive. Further, a fifth layer 150 of the membrane 110 is included that is formed of non-conductive adhesive that includes upper and lower wings/tabs 152, 153 and right and left side wings/tabs 154, 155 that match the size and location of the wings/tabs 132, 133, 134, and 135 of the third layer 130. From FIGS. 3 and 4, it should be clear that the wings/tabs of the third and fifth layers 130, 150 extend outward a distance from the main body or substrate of the membrane 110 provided by a combination of the all the membrane layers so as to allow them to extend around the edges/ends of a mated/received circuit board to attach onto or engage a surface of the circuit board opposite the one abutting the second side of the outer or first layer 112.

The membrane 110 has a thickness, $t_{membrane}$, defined by a combined thickness of each of its layers including layers 112, 130, 150, and 170 and as measured from an exposed side of the body 172 of the ninth layer 170 to the first side 113 of the first or outer layer 112 of the membrane 110. The thickness, $t_{membrane}$, is chosen to match an amount of travel of a mechanical switch 189 that is placed in a switch passageway or channel 188 in the membrane body or substrate, which is defined by openings in one or more of the layers including layer 170 as shown in FIG. 4. The mechanical switch 189 may take the form of a dome switch or the like that has a predefined amount of linear travel to be fully actuated, and the travel of the switch 189 may further be facilitated by providing the domed or embossed element 118 in the first or outer layer 112 that allows further travel than just the membrane body/substrate thickness, $t_{membrane}$. The opposite side of the switch 189 (not shown in FIG. 4) is typically affixed to or abutting a second or inner side of the outer or first layer 112 while the side shown would be positioned above an actuatable feature of a circuit board (a feature or component that is actuated by moving the switch 189 from an at-rest position (shown) to a deformed or actuated position (not shown)).

The layers of the body of the membrane 110, including layer 170, are also adapted to defined a plurality of light passageways or tubes to better disburse light emitted from lights on a circuit board. The light from each source (or LED) on the board are kept separated as it travels the length of each passageway 184 (which matches the body/substrate thickness, $t_{membrane}$). The light is then made better visible or more uniformly disbursed at or provided at a viewing angle that is 30 degrees or more through the further inclusion of domed or lens elements 116 and 117 in the first or outer layer 112 as discussed below.

Figure 5:
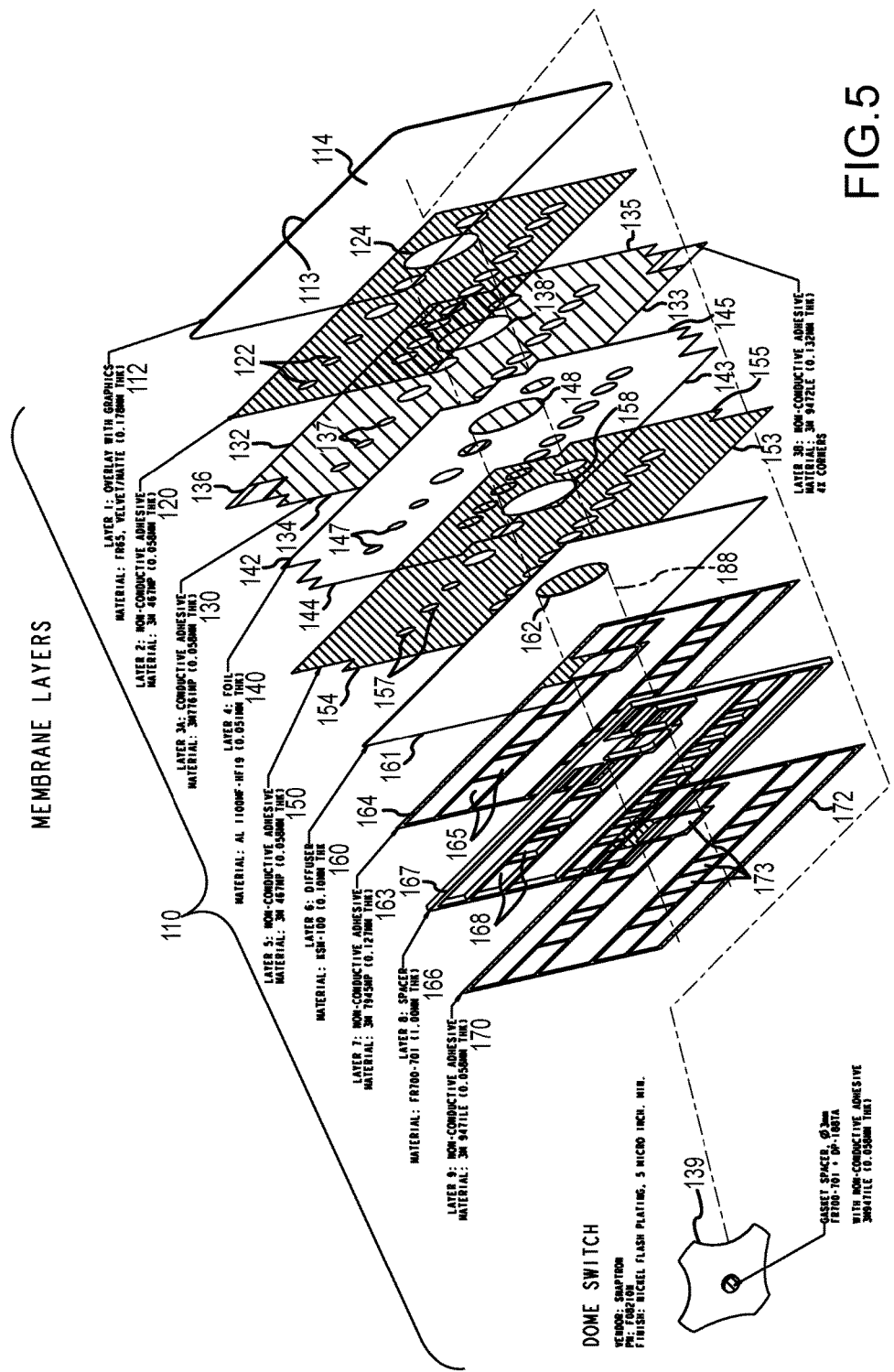
FIG. 5 is an exploded view of the membrane layers of the membrane of FIGS. 3 and 4 prior to assembly to form the membrane.

FIG. 5 shows an exploded view of the membrane 110 and its layers prior to assembly to form the unitary component as shown in FIGS. 3 and 4. As shown, the membrane 110 includes a first or outer layer 112 with a first side 113 with graphics and with domed or lens elements. The first layer 112 has a second or inner side 114 that abuts a second layer 120 and upon which a mechanical switch 189 in the form, in this case, of a dome switch is mounted (such as with a non-conductive adhesive) so as to extend through the switch passageway 188 formed by a combination of holes or openings in each of the next 8 layers. The first or outer layer 112 may be formed of a clear material such as a clear plastic (e.g., a polycarbonate film with a thickness in the range of 0.15 to 0.2 millimeters (mms) or the like with 0.178 mm thick film used in one prototype) such as that available from Lexan or other distributors (e.g., Lexan's FR65).

Figure 6:
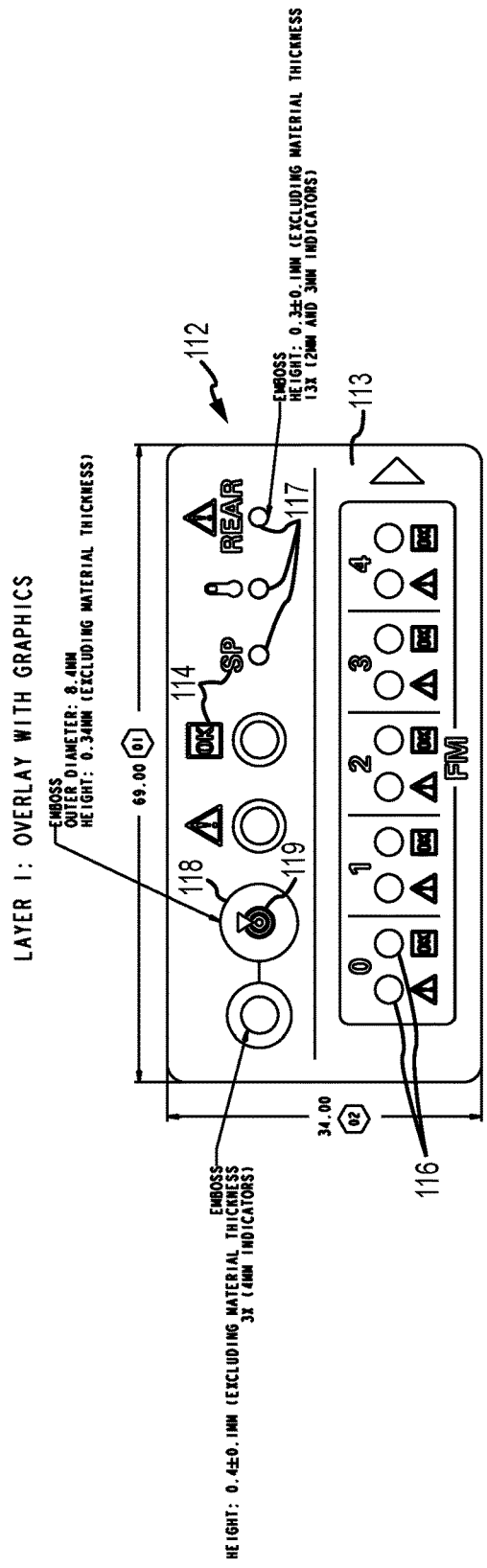
FIG. 6 is a front view of the first or outer layer of the membrane of FIG. 5 providing additional manufacturing detail of an exemplary embodiment.

FIG. 6 is a front view of the first or outer layer of the membrane 112 providing additional manufacturing detail of an exemplary embodiment, and, particularly, FIG. 6 shows that embossing may be used to make the lens elements 116 and 117 domed or semi-spherical in shape (e.g., with a height of 0.2 to 0.5 mm for 2 to 4 mm indicators on a circuit board) and also switch element 118 (e.g., with an OD of 5 to 10 mm or the like (8.4 mm shown) and a height of 0.25 to 0.5 mm (with 0.34 mm shown)).

Figure 7:
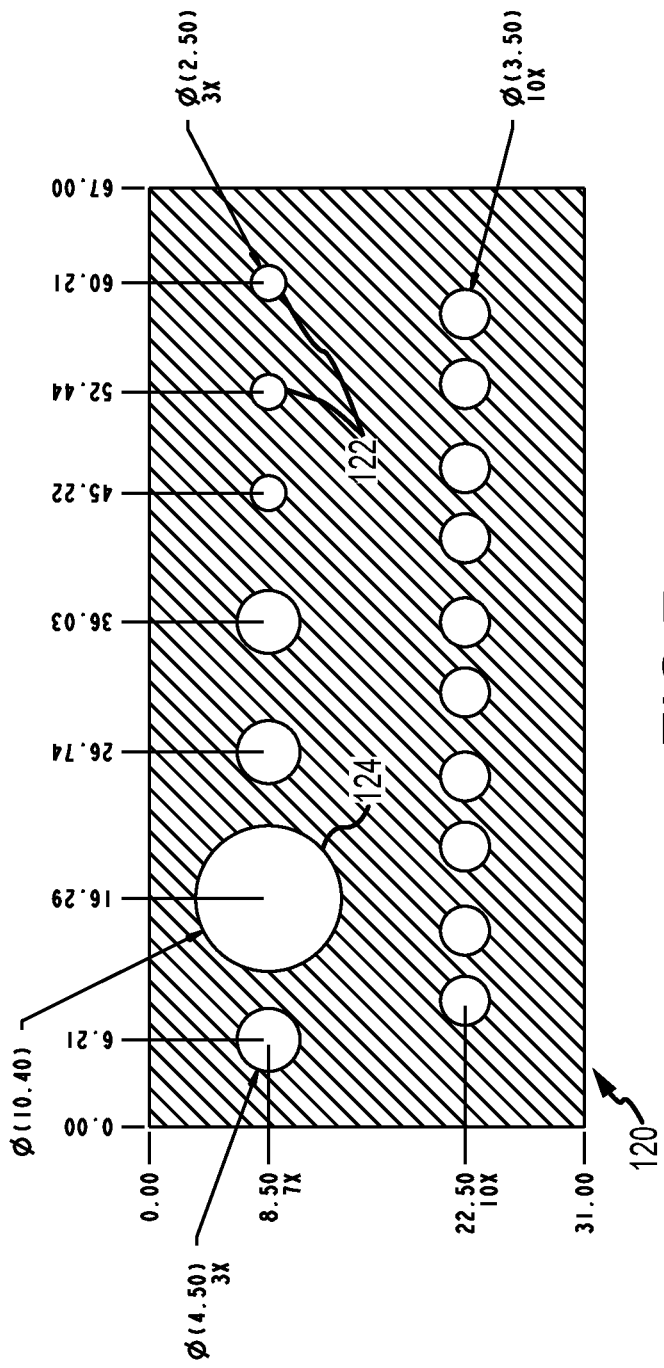
FIG. 7 is a front view of the second layer of the membrane of FIG. 5.

The membrane 110 further includes a second layer 120 that may be formed of a non-conductive material (such as non-conductive adhesive with a thickness in the range of 0.04 to 0.07 mm (with 0.058 mm thick shown) such as 3M's 467MP or the like). In the membrane 110, the second layer 120 abuts the second or inner side 114 of the first or outer layer 112, and the second layer 120 typically has a shape and size that matches that of the first or outer layer 112 (with both being shown to be rectangular in this example membrane 110 suited for placement on a rectangular circuit board with a similar shape and size). The second layer includes holes or openings 122 and 124 (here shown as circular holes) for providing, respectively, a portion of a set of light passageways (e.g., passageways 184 shown in FIG. 4) and a portion of a physical switch passageway or channel 188. FIG. 7 shows a front view of the second layer 120 providing additional location and size details for the openings/holes 122, 124.

Significantly, the membrane 110 is adapted to provide EMI containment, and this is achieved by the inclusion and combination of the third and fourth layers 130 and 140. The third layer 130 has a body or central rectangular portion and a set of wings/tabs (i.e., top and bottom wings/tabs 132, 133 and left and right wings/tabs 134, 135) that are formed of a conductive material such as a conductive adhesive (e.g., 3M's 7761MP or the like), which may have a thickness similar to that of the second layer 120. The wings/tabs 132, 133, 134, and 135 are configured to extend outward a distance along each edge of the main body of the layer 130 (with the body typically having a shape and size matching that of the first two layers 112, 120 (and that of the corresponding circuit board)), with this distance of extension selected to allow the conductive material of the layer 130 to be wrapped wholly about the edges/ends of the circuit board and to mate with a back or rear surface/side of the board (as can be seen in FIG. 2 for assembly 100).

Figure 8:
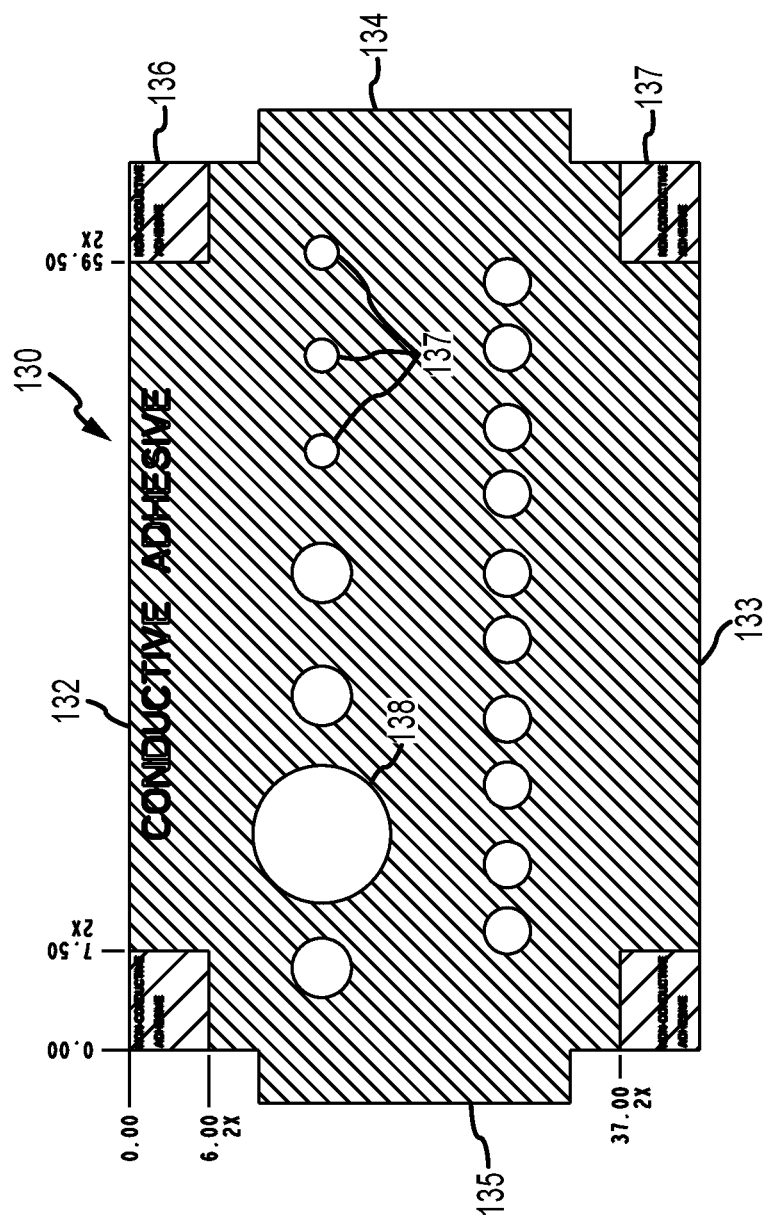
FIG. 8 is a front view of the third layer of the membrane of FIG. 5.

Because the layer 130 is the first in the stack to have the outwardly-extending wings/tabs, these tabs/wings 132-135 are exposed when the membrane 110 is applied to a circuit board as can be seen for board 190 in assembly 100 in FIG. 2 where the tabs/wings 132-135 are visible on the rear or back side 192 of the board 190. The layer 130 also includes openings 137 to provide light passageways (e.g., passageways 184) and to provide the physical passageway/channel 188 for switch 189. FIG. 8 is a front view of the layer 130 providing additional manufacturing details. Particularly, the corners 136, 137 of the layer 130 are more clearly shown as extending along the top and bottom edges from the top and bottom wings/tabs 132, 133, and the corners 136, 137 (as well as the right upper and lower corners) of the layer 130 are formed of non-conductive material (such as a non-conductive adhesive (e.g., 3M's 9472LE at the same thickness as the rest of layer 130 or at a greater thickness in some cases (with a thickness of 0.132 mm shown)).

In combination with layer 130 to provide EMI containment, the membrane 110 includes a fourth layer 140 that abuts the third layer 130. The fourth layer 140 includes a body formed to have a shape and size matching that of the third layer 130 but without the four corners (e.g., corners 136 and 137 and upper and lower right corners). Particularly, the fourth layer 140 includes a central portion from which top and bottom wings/tabs 142, 143 and left and right wings/tabs 144, 145 extend and these tabs/wings 142, 143, 144, 145 are shaped and sized to adjacent wings/tables 132, 133, 134, 135 on the third layer 130 and are located to abut and be mated to these corresponding tabs/wings of the third layer 130.

Figure 9:
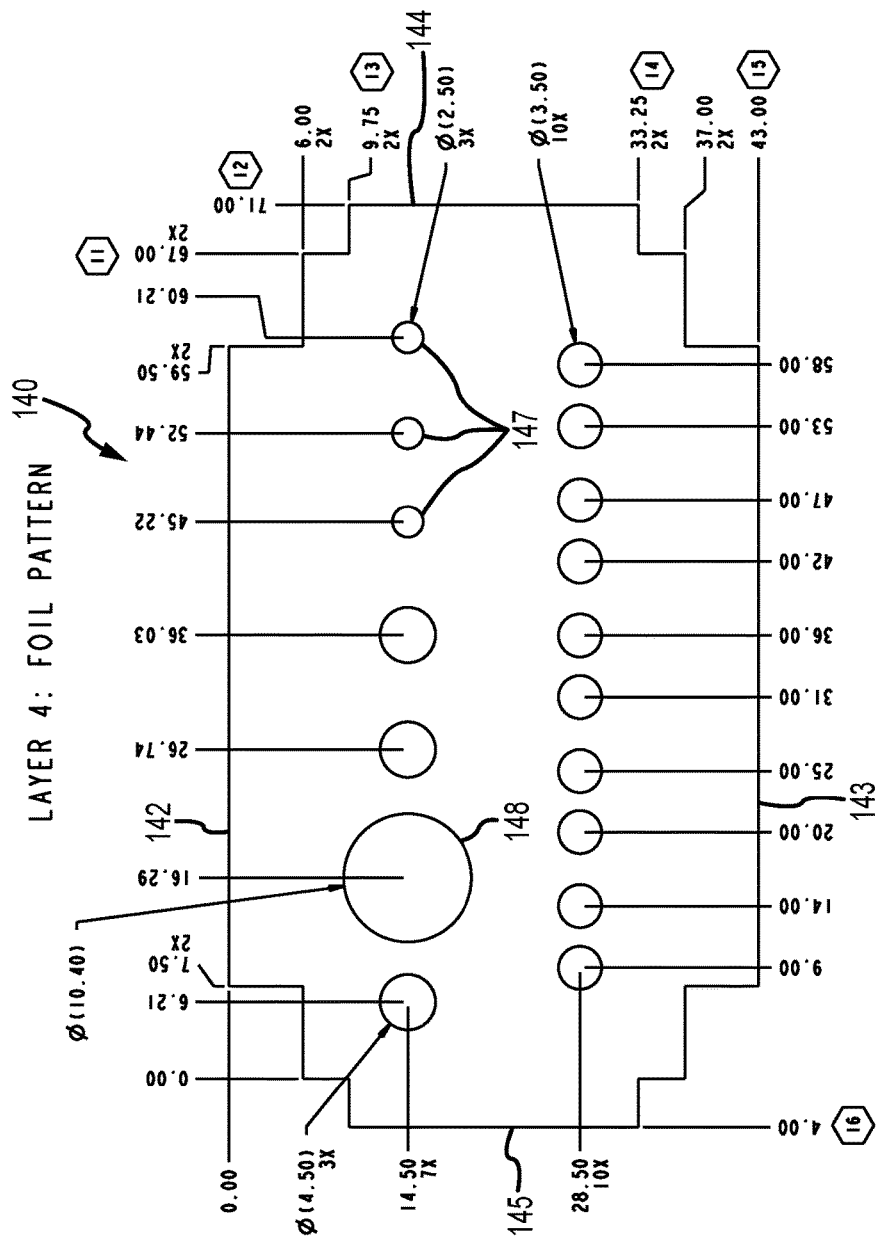
FIG. 9 is a front view of the fourth layer of the membrane of FIG. 5.

As a result, the material of the fourth layer 140 will cover the front side of a circuit board (such as board 190) and will also wrap wholly around the edges/ends of the board and mate with a portion of the back or rear side of the board (such as side 192 of board 190) as is the case with the material of the third layer 130. The layer 140 also includes opening/holes 147 to provide the light passageways (such as passageways 184) in the membrane 110 and opening/hole 148 to provide the physical passageway/channel 188 for the switch 189 to extend through the membrane 110 from the first/outer layer 112 to the board's front surface/side when the membrane 110 is applied to a board to form an assembly 100. To achieve EMI shielding or containment, the material of the fourth layer is a metal film or foil such as an aluminum foil (e.g., aluminum foil that is 0.04 to 0.07 mm thick or greater (with 0.051 mm thick shown)). FIG. 9 is a front view of the foil layer 140 providing additional details on its manufacture such as its shape and the size and location of the holes/openings for providing lighting and switch passageways.

As shown in FIG. 5, the membrane 110 further includes an additional layer of non-conductive material such that the EMC layers 130 and 140 are sandwiched by non-conductive material. Particularly, the membrane 110 is shown to include a fifth layer 150 in the form of a film or layer of non-conductive adhesive (e.g., 3M's 467MP or the like) with a thickness similar to that of the second layer 120. The fifth layer 150 is sized and shaped similar to that of the third layer 130 (including the four corners 136 and 137 and the upper and bottom right corners in addition to the conductive material/body of the layer 130). Particularly, the layer 150 includes top and bottom tabs/wings 152, 153 and left and right side wings 154, 155 that extend outward from a rectangular body that are located, sized, and shaped to match those of layer 130.

Figure 10:
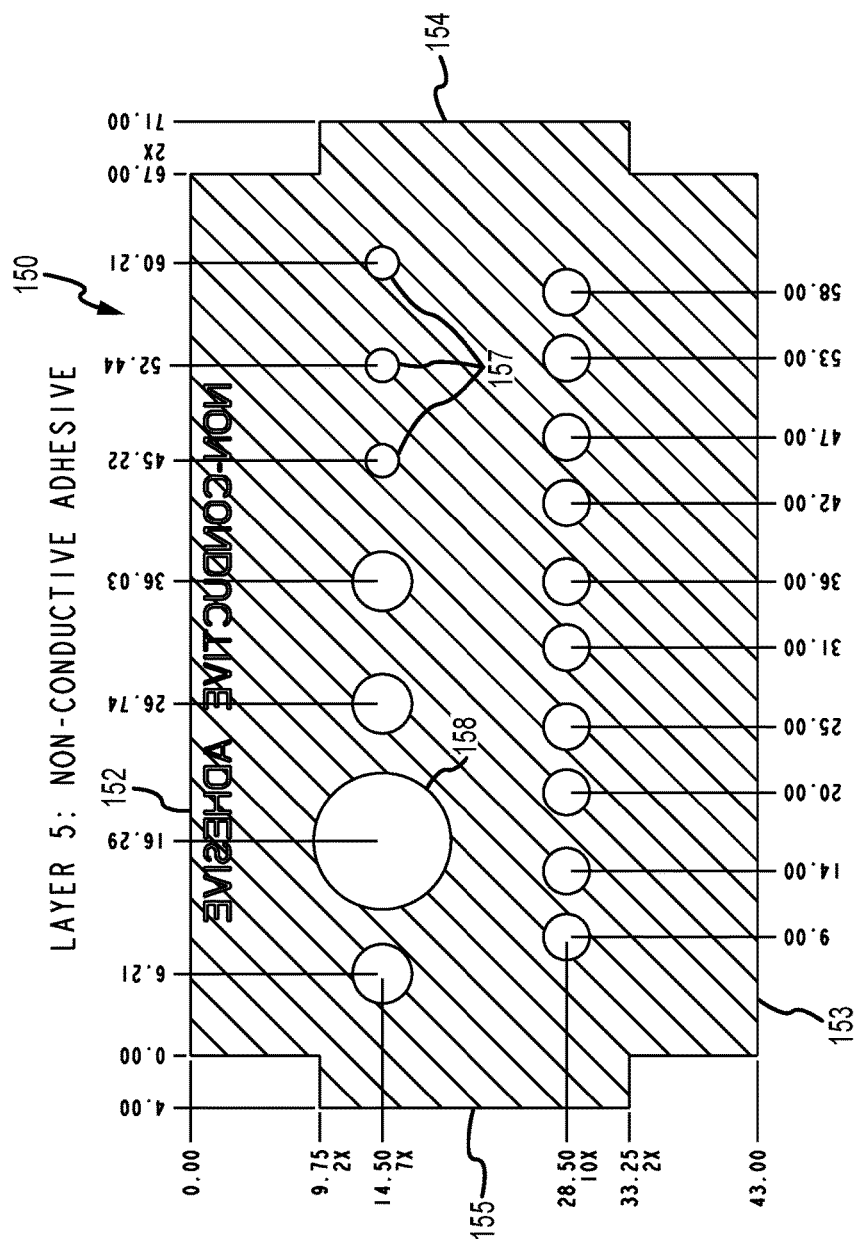
FIG. 10 is a front view of the fifth layer of the membrane of FIG. 5.

The layer 150 is shown to include holes/openings 157 to provide light passageways (e.g., part of the sidewalls of passageways 184) and a hole/opening 158 to provide a part of the sidewall of switch passageway 188, and it can be seen that the holes/openings in each layer are aligned (e.g., with a central axis of the each passageways extending through the corresponding holes/openings in each layer). Also, from a review of the second through the fifth layers, it can be seen that the light passageways are cylindrical (or each hole/opening in these layers is circular), and the OD of this cylindrical passageway (or outer portion of passageways 184) may be chosen to be the same as that of the OD of corresponding domed or lens elements in the first layer 112 (e.g., 2 to 5 mm ODs or the like). FIG. 10 illustrates additional fabrication details for the layer 150. Because the layer 150 is the final or most inward layer with tabs/wings 152-155, these are exposed in the assembled membrane 110 as can be seen in FIG. 4 (rear view of the membrane 110), and the non-conductive material of these wings/tabs 152-155 abut and/or mate with the edges/side and back surface 192 of the circuit board 190 when the membrane 110 is applied to the board (so that these tabs/wings 152-155 are not visible in the assembly 100 shown in FIG. 2 as they are covered by or inboard to the conductive wings/tabs 132-135 of the third layer 130).

Figure 11:
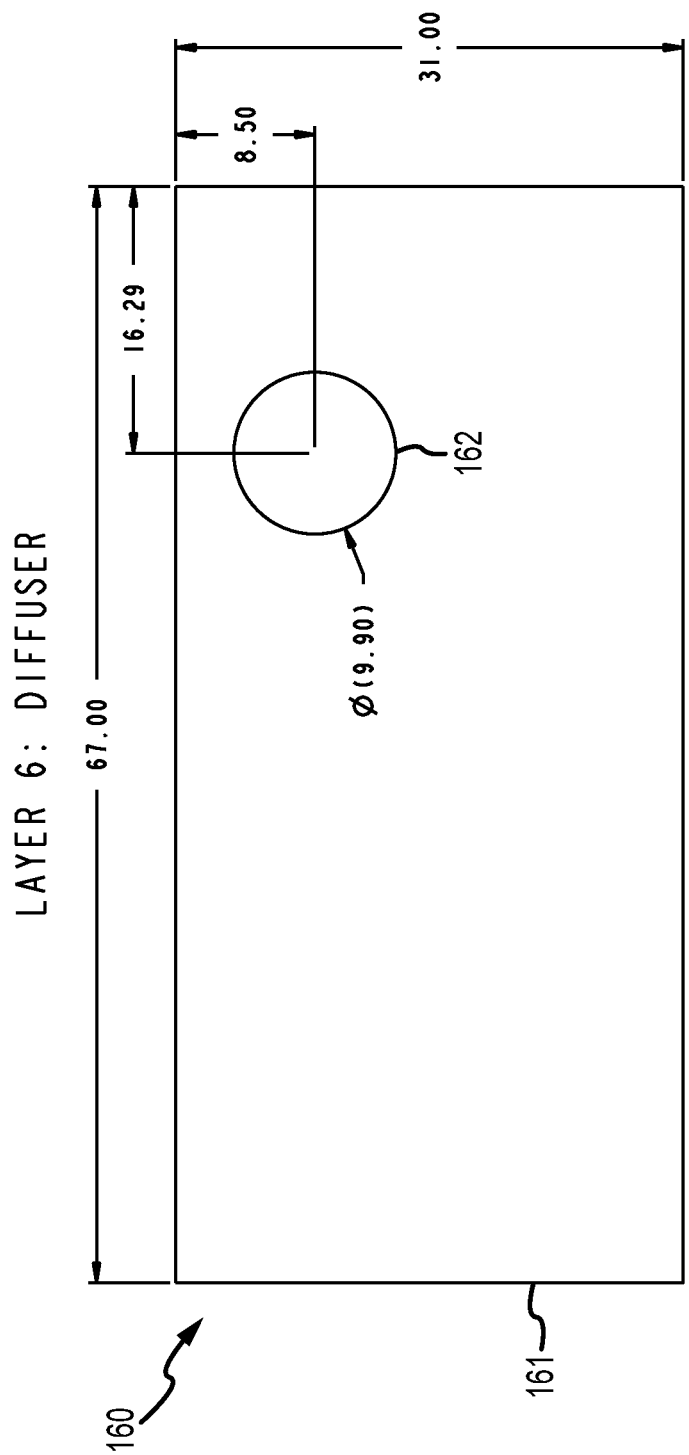
FIG. 11 is a front view of the sixth or diffuser layer of the membrane of FIG. 5.

As shown in FIG. 5, the membrane 110 further includes a sixth layer 160 that is configured to act as a diffuser for the membrane 110. Particularly, the sixth layer 160 has a body 161 that is solid except for the hole/opening 162 to provide a portion of the passageway/channel 188 for the linear-actuated switch 189 through the overall body of the membrane 110. FIG. 11 is a front view of the layer 160 and provides additional fabrication details for this diffuser component including that the size and shape of the layer's body 161 matches that of the first layer 112 (and front side of the board 190). The body 161 does not have openings/holes for the light passageways 184 such that the material of the body 161 is inserted into each of these passageways 184 and acts to further diffuse the light from the lights/LEDs of the circuit board 190. To provide useful light diffusion of the light, the body 161 may be formed of any material useful as a diffuser such as a translucent plastic and with a thickness useful for light diffusion (e.g., thickness in the range of 0.05 to 0.3 mm with 0.10 mm shown).

Figure 12:
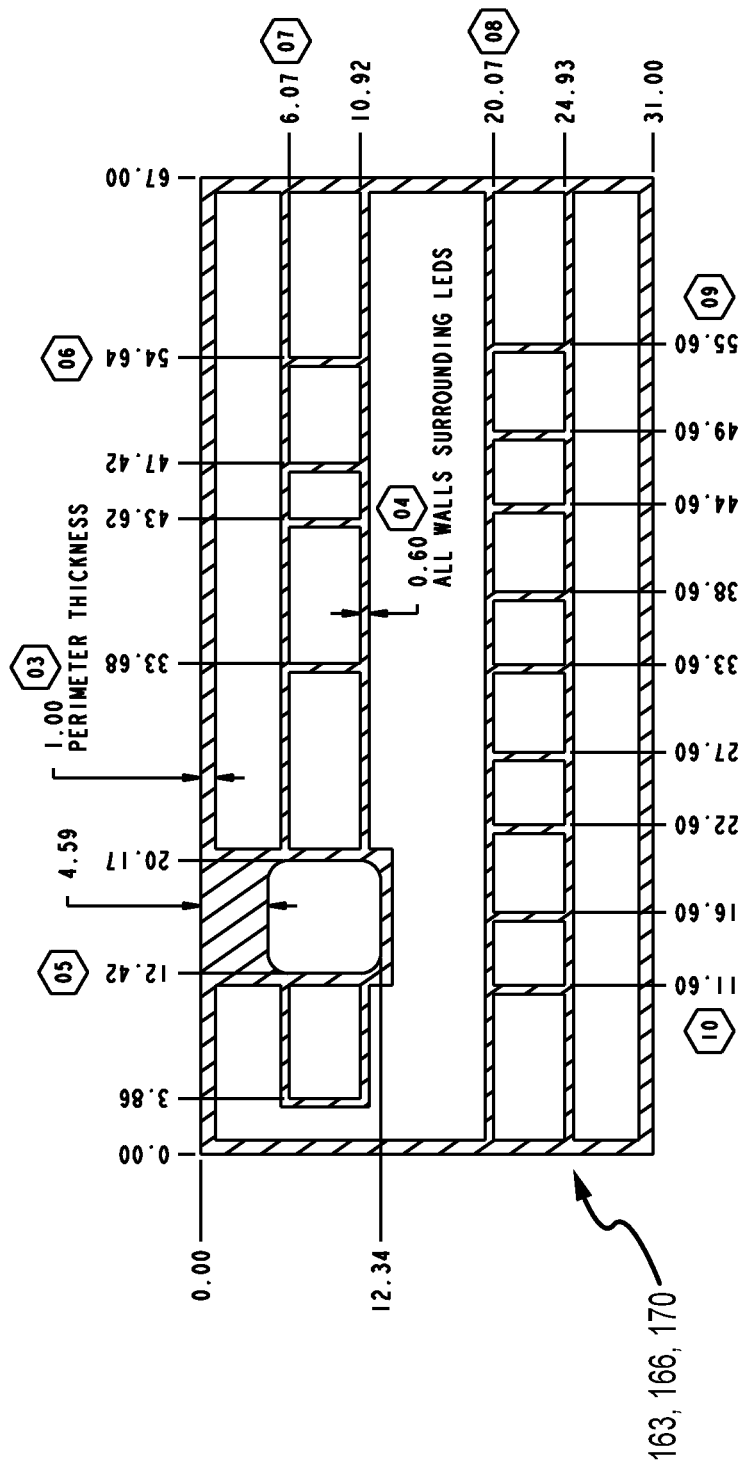
FIG. 12 is a front view of the fabrication pattern for the seventh, eighth, and ninth layers of the membrane of FIG. 5.

FIG. 5 also shows that the membrane 110 includes additional layers (or seventh, eighth, and ninth layers) 163, 166, and 170 that function to provide a thickness of the overall membrane body that suits the travel of the switch 189 and to allow the membrane to be attached to the front side of the circuit board 190. FIG. 12 provides a front view of the pattern for fabricating the bodies 164, 167, 172 of the layers 163, 166, and 170 showing the size and location of the holes/openings 165, 168, and 173 that are cut into the bodies 164, 167, and 172 to provide passageways for light (passageways 184) and a passageway 188 for the switch 189. The layer 166 acts as a spacer for the membrane 110 to define its overall thickness, $t_{membrane}$, and may be an opaque plastic layer that is relatively thick compared with the other layers such as in the range of 0.5 to 2 mm (with 1 mm thick shown in FIG. 5). The material of layer 166 is opaque so that the light from the lights/LEDs on the circuit board 190 is not mixed as it travels along a light passageway 184. The layer 163 is used to attach the spacer layer 166 to the diffuser layer 160 and may be formed of a non-conductive adhesive (e.g., 3M's 7945MP or the like) in the thickness range of 0.1 to 0.15 mm with 0.127 mm shown in FIG. 5. The innermost or last layer 170 acts to affix the membrane 110 to the front side of the circuit board 190 and may be formed of a non-conductive adhesive (e.g., 3M's 9471LE or the like) at a thickness in the range of 0.04 to 0.07 mm with a thickness of 0.058 mm shown in FIG. 5.

Figure 13A:
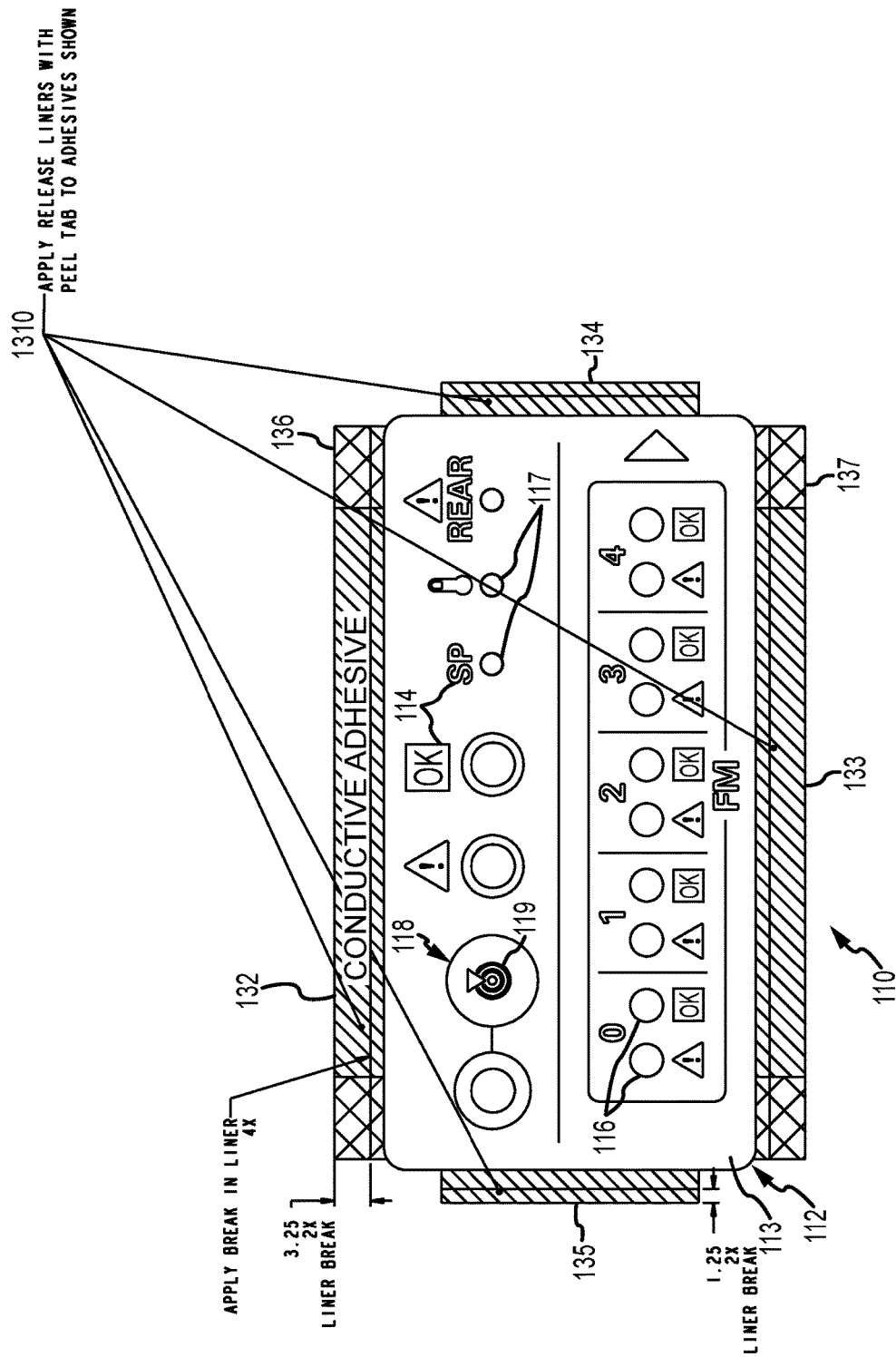
FIGS. 13A and 13B provide front and rear views of fully assembled membranes similar to FIGS. 3 and 4 but further showing application locations for a set of release liners.
Figure 13B:
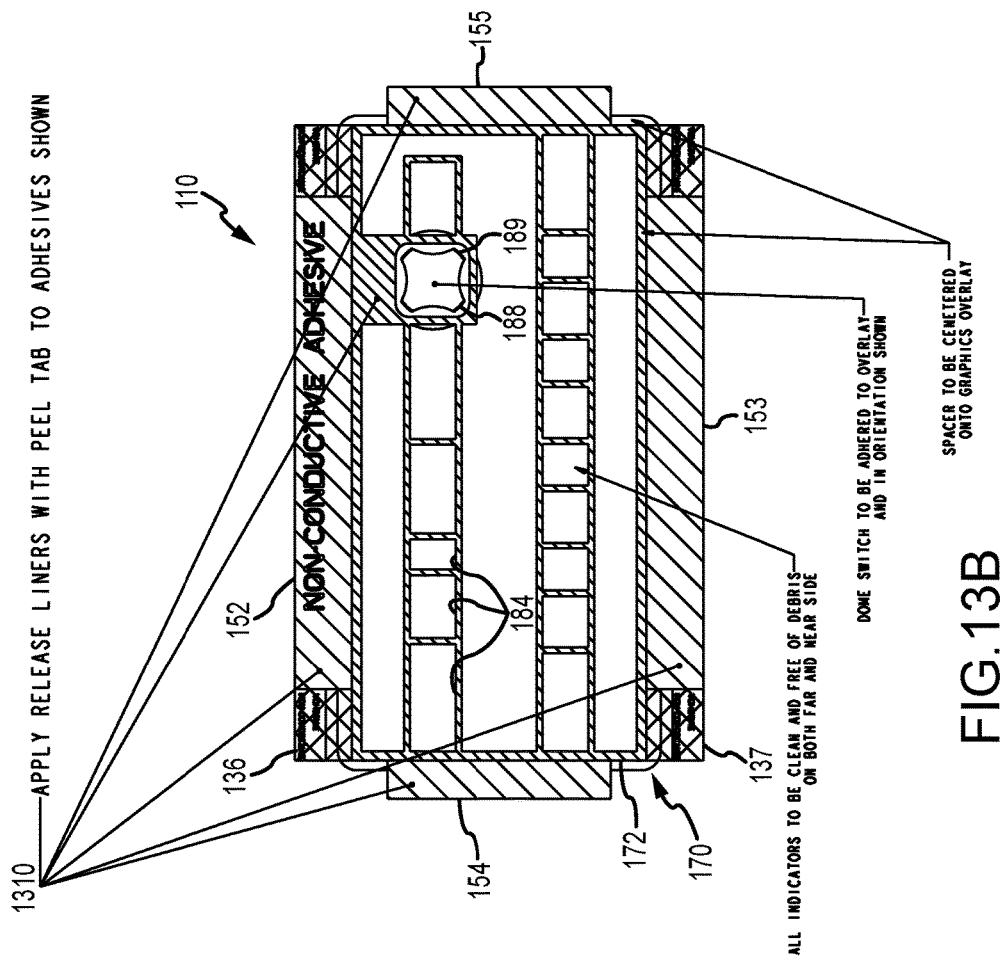

FIGS. 13A and 13B provide front and rear views of the fully assembled membrane 110 similar to FIGS. 3 and 4 but further showing application locations for a set of release liners 1310 after assembly of the layers 112, 120, 130, 140, 150, 160, 163, 166, and 170. As shown, release liners 1310 are applied with peel tabs to the exposed adhesive components of the membrane 110 including top and bottom tabs/wings 132, 152 and 133, 153 and left and right tabs/wings 134, 154 and 135, 155. Further, the dome or other mechanical switch 189 is adhered to the membrane 110 via passageway 188 to the second side 114 of the first or outer layer (or overlay) 112. Also, during assembly of the membrane 110, the spacer or eighth layer 166 is centered onto the graphics first layer or overlay 112 prior to its being bound to the other components of the membrane 110.

Figure 14A:
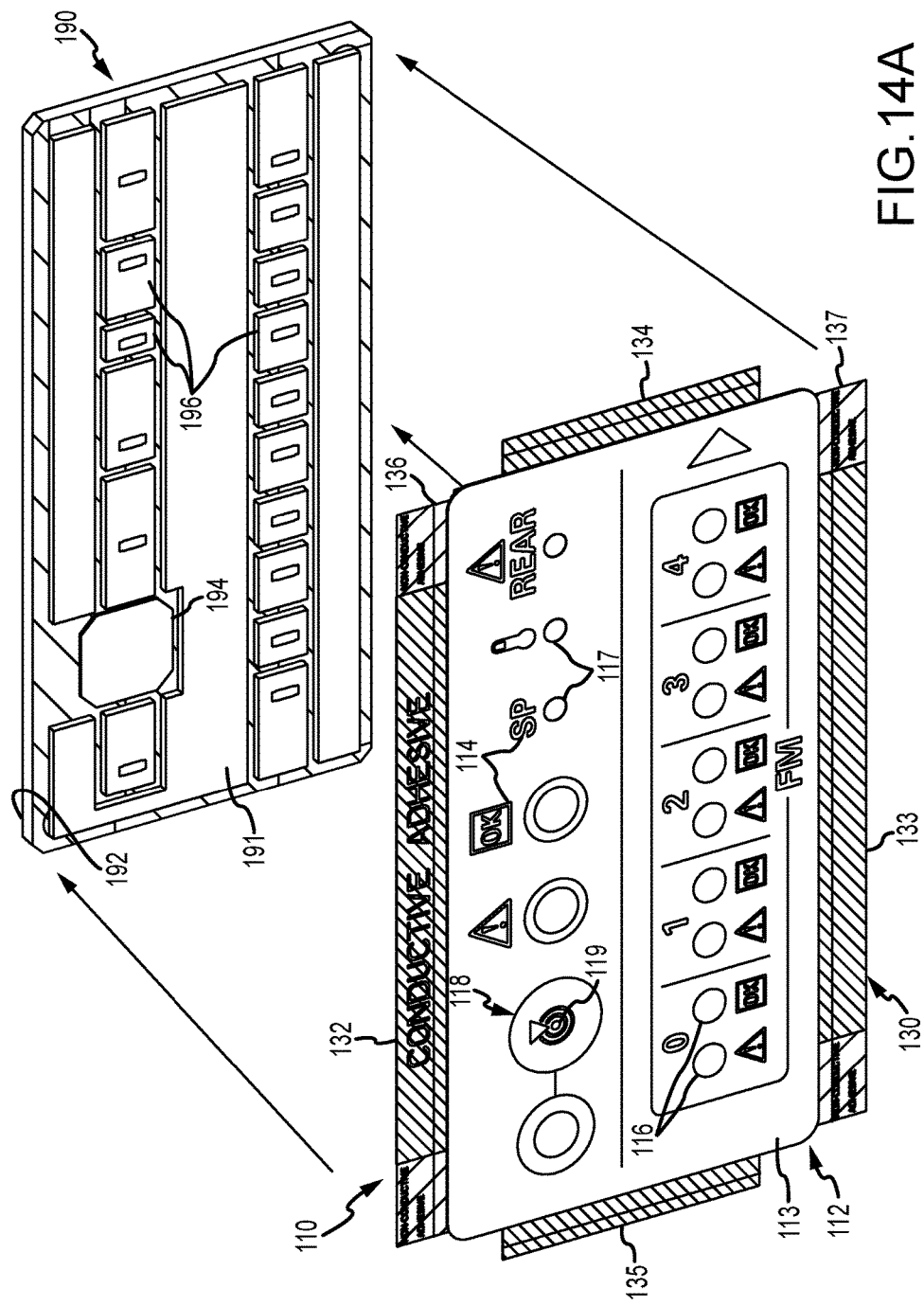
Figure 14B:
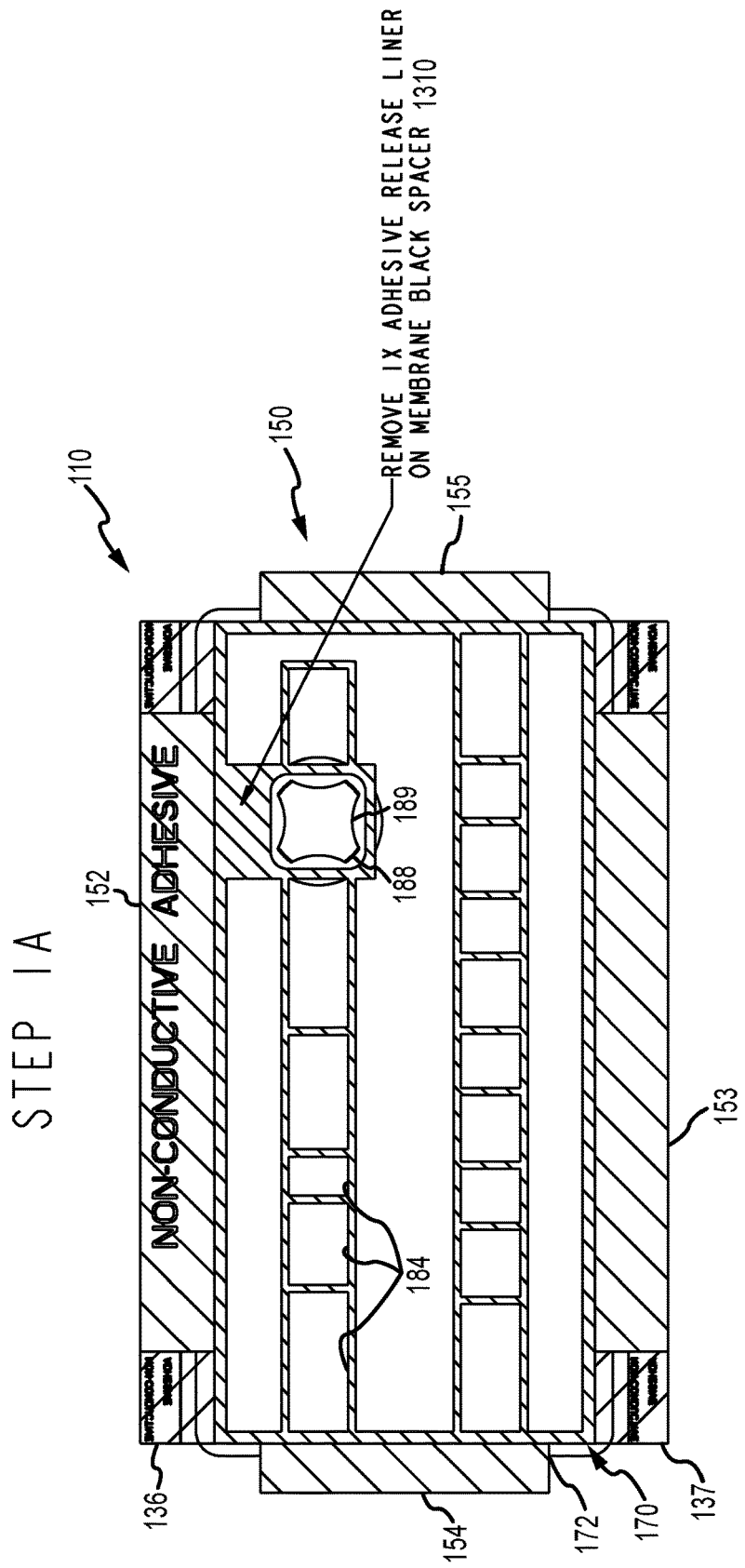
Figures 3, 14C:
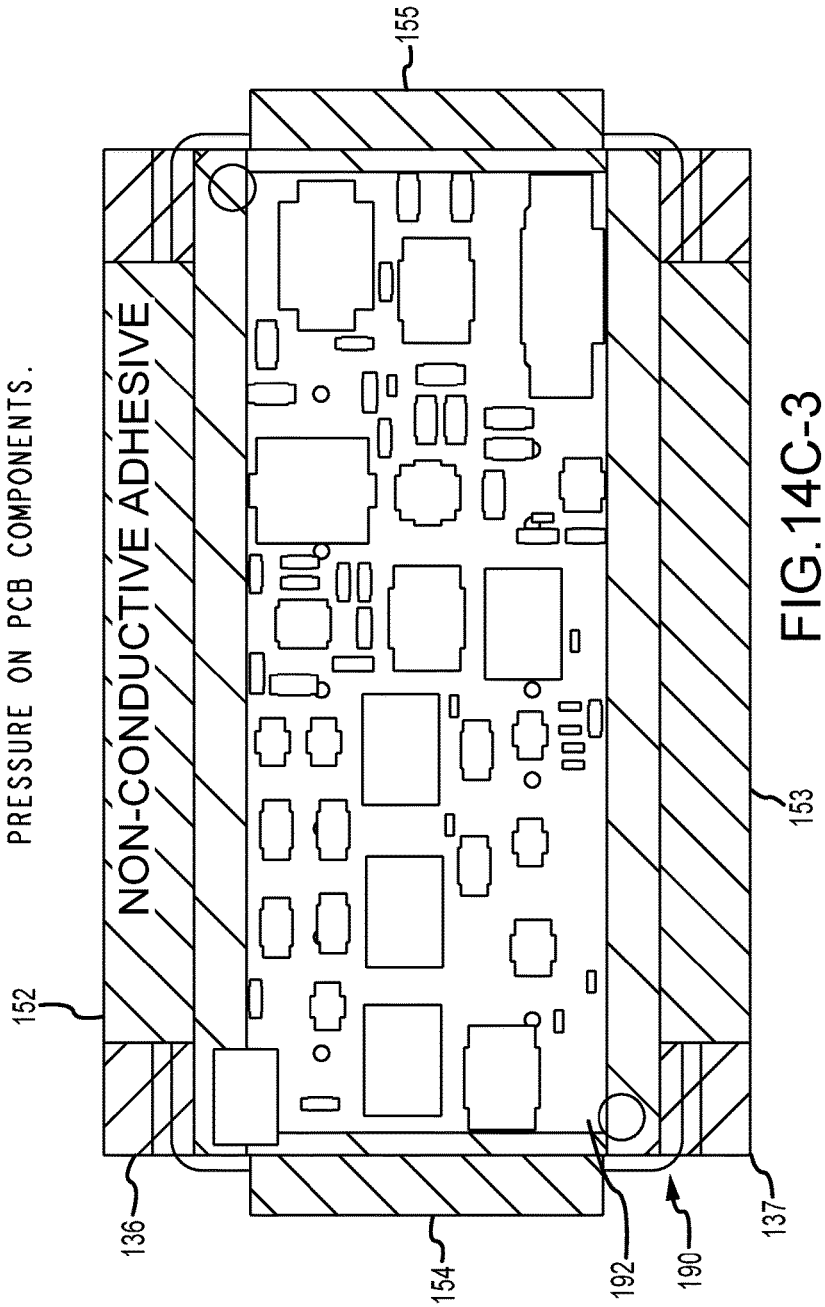
Figures 1, 15B:
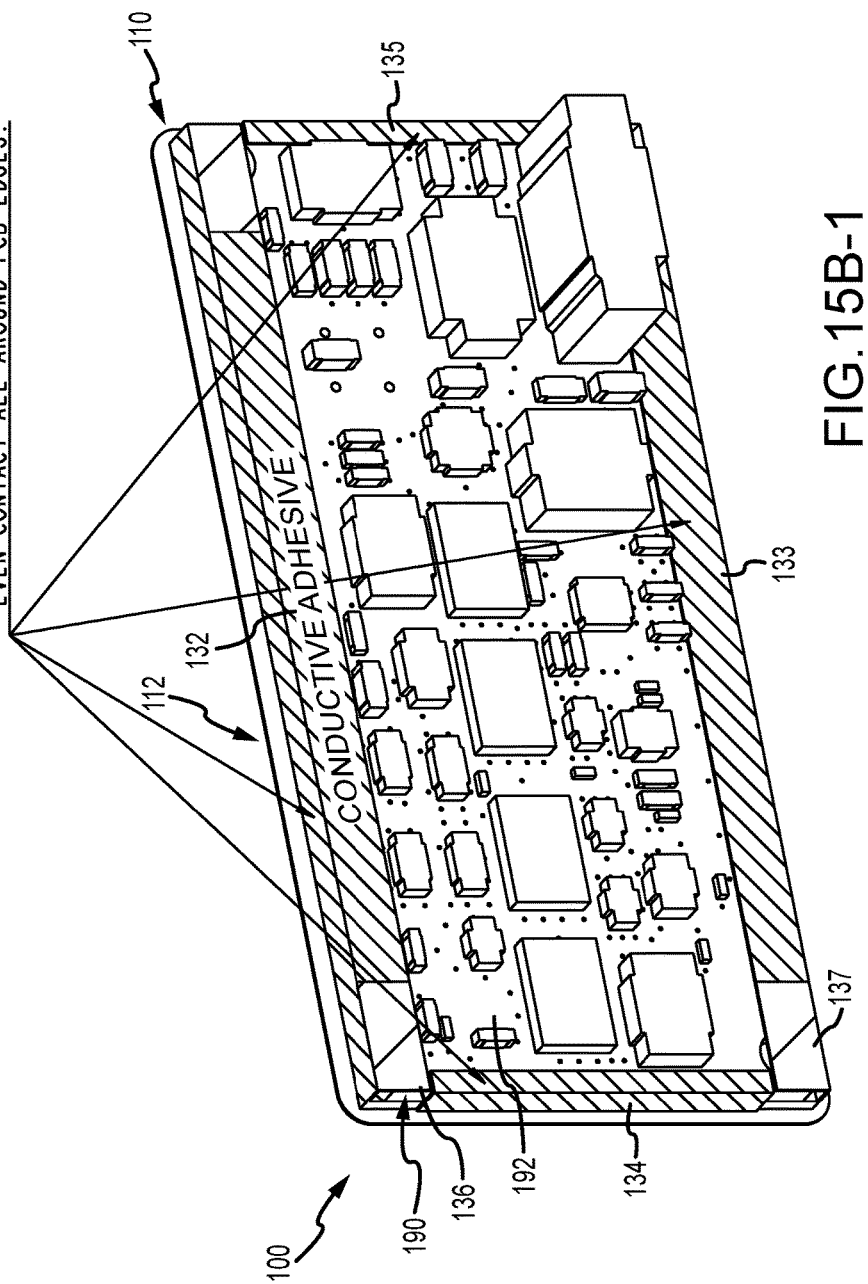

Once the membrane if assembled as shown in FIG. 13, a functional EMC assembly 100 as shown in FIGS. 1 and 2 can be formed. FIGS. 14A-14C illustrate initial steps for assembling the functional EMC assembly 100 while FIGS. 15A and 15B illustrate final steps for assembling the functional EMC assembly 100. As shown in FIG. 14A, the circuit board 190 has a front or first side 191 that faces the inner layer or side of the membrane 110 (i.e., ninth layer 170 formed of non-conductive adhesive). The front or first side 191 includes a button 194, and, during assembly, the button 194 is aligned with the membrane switch 189. The front or first side also includes a number or set of lights (e.g., LEDs) 196, and, during assembly, each of these is aligned with a light passageway 184 in the membrane 110 to provide the light diffusion or indicator visibility functions of the membrane 110 described herein during use of the functional EMC assembly 100.

In the initial step shown in FIG. 14B, the adhesive liner 1310 is removed from the membrane 110 (e.g., from the membrane spacer layer 166 and inner layer 170). In the next steps shown in FIG. 14C, the board's button 194 is aligned with the membrane button/switch 189. Then, the circuit board edges are aligned with edges of the spacer layer 166. Finally, in FIGS. 14C1=14C3, the assembling process includes placing the circuit board 190 on top of the membrane's spacer layer 166 and inner adhesive layer 170, and firm pressure is then applied all around the perimeter of the board 190.

In the assembling step shown in FIG. 15A, the release liners 1310 are removed from the tabs/wings 152, 153, 154, 155 on the non-conductive adhesive of the fifth layer 150. In the process shown in FIGS. 15B1 and 15B2, the four foil tabs/wings/flaps 142, 143, 144, 145 of the fourth layer 140 are folded over onto the second or back side 192 of the circuit board 190. In this step, the technician assembling the functional EMC assembly 100 acts to ensure that the metal foil of the layer 140 makes full and even contact all around the circuit board edges/ends. Also, as shown in the right portion of FIGS. 15B1 and 15B2, the final step(s) of the assembling involves ensuring the foil of layer 140 does not overlap or touch any components of on the back side 192 of the board 190. The conductive release liners 1310 are not removed in this assembling process, and they are removed to attach the functional EMC assembly 100 to an enclosure, with the tabs or wings 132, 133, 134, 135 used to affix the assembly 100 to a sidewall of the enclosure to cover/plug a hole/opening in one of the enclosures metallic sidewalls (i.e., with conductive material of the layer 130 being in electrical contact with conductive material of the enclosure's sidewall about the periphery of the opening/hole in the enclosure).

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

From the above description, several technical differences between prior devices and the functional EMC assembly will be clear to the person skilled in the art. The assembly uses a spacer and an aluminum foil wrap around layer (or other metal layer) to enclose the circuit board (such as to enclose a PCA or the like). The visibility of indicators via lights (e.g., LEDs) on the circuit board are enhanced via research of dome or lens element contours in the membrane as it relates to specific combinations of lights/LEDs and spacer thicknesses.

The membrane is made up of multiple layers. One of the layers is formed of an EMI-shielding material such as aluminum foil. This EMI-shielding layer wraps around all sides or edges of the circuit board providing complete EMI containment. The combination of spacer thickness (providing by the membrane layers) and light type (LED type, for example) is used to determine or define the indicator dome or lens element contour (or dimensions/shape). This contour/size/shape often will be empirically determined such as via a luminance test for any combination not already used in experiments. The functional EMC assembly may be used in any product having to deal with tight design constraints regarding cost, footprint, and EMI containment while still providing the functionality of PCAs, labels, switches, and/or indicators on an enclosure.

Traditional membranes have a trace tail as the membrane and PCA or board are two separate components. The tail is typically snaked into an enclosure, where the PCA is hidden and protected from EMI, and the tail is connected to the PCA via its onboard zero insertion force (zif) connector. The new EMC assembly eliminates the need for a trace tail and zif connector components and provides design flexibility by not requiring that the PCA be hidden inside an EMI enclosure.

We claim:

1. An apparatus for mounting over an opening in an electronics enclosure to provide electromagnetic interference (EMI) containment and other functions, comprising:
   a circuit board with a function-triggering button on a front side; and
   a membrane attached to and covering the front side of the circuit board comprising a plurality of layers including an inner layer formed of an adhesive material abutting the front side of the circuit board and an outer layer formed of a clear material with a first side facing away from the circuit board and a second side facing toward the circuit board,
   wherein the plurality of layers includes a foil layer positioned between the inner layer and the outer layer that comprises a body formed of a metal foil,
   wherein the membrane further includes a linear-actuated switch abutting the second side of the outer layer and extending through a switch passageway provided through the inner layer and the foil layer, whereby the function-triggering button is activated when the linear-actuated switch is moved linearly through a predefined amount of travel,
   wherein the metal foil comprises aluminum foil,
   wherein the body of the foil layer extends over the front side of the circuit board,
   wherein the foil layer further comprises four tabs extending outward from sides of the body, and
   wherein each of the tabs extends over an edge of the circuit board and abuts a portion of a back side of the circuit board opposite the front side of the circuit board.

2. The apparatus of claim 1, wherein the plurality of layers further includes a layer of conductive adhesive positioned between the foil layer and the outer layer, wherein the layer of conductive adhesive includes a hole aligned with the switch passageway to allow the linear-actuated switch to pass through the layer of conductive adhesive, and wherein the layer of conductive adhesive includes four tabs extending outward from a central body to cover each of the tabs of the foil layer on the back side of the circuit board.

3. The apparatus of claim 1, wherein the first side of the outer layer of the membrane includes a domed switch element extending outward from the circuit board a distance and with a center aligned with a center of the linearly-actuated switch and wherein the plurality of layers have a thickness when combined with the distance that matches the predefined amount of travel.

4. The apparatus of claim 3, wherein the linearly-actuated switch comprises a dome switch.

5. The apparatus of claim 1, wherein openings are provided in the inner layer and the foil layer to define a plurality of light passageways, wherein the first side of the outer layer comprises a plurality of domed lens elements each aligned with one of the light passageways, and wherein the circuit board comprises a light source on the front side aligned with each of the light passageways, whereby light from each light source is passed through the plurality of layers via the light passageways and is diffused at a viewing angle of at least 30 degrees by one of the domed lens elements.

6. An apparatus for providing electromagnetic interference (EMI) containment and other functionality, comprising:
   a circuit board with light sources on a front side; and
   a membrane covering the front side of the circuit board comprising a set of layers including an inner layer formed of a non-conductive adhesive abutting the front side of the circuit board,
   wherein the set of layers further includes an outer layer with a first side facing away from the circuit board and a second side facing toward the circuit board,
   wherein the set of layers includes a foil layer positioned between the inner layer and the outer layer and comprising a body formed of a metal foil,
   wherein holes are provided in the inner layer and the foil layer defining a plurality of light passageways each aligned with one of the light sources,
   wherein the first side of the outer layer comprises a plurality of domed lens elements each aligned with one of the light passageways, and
   wherein light emitted from each light source is passed through the set of layers via the light passageways and is diffused at a viewing angle of at least 30 degrees by one of the domed lens elements.

7. The apparatus of claim 6, wherein the set of layers of the membrane further comprises a diffuser layer disposed between the inner layer and the foil layer and wherein the diffuser layer comprises a body formed of a translucent plastic extending through the light passageways.

8. The apparatus of claim 6, wherein the metal foil comprises aluminum foil and wherein the body of the foil layer extends over the front side of the circuit board.

9. The apparatus of claim 8, wherein the foil layer further comprises tabs extending outward from sides of the body and wherein each of the tabs extends over an edge of the circuit board and abuts a portion of a back side of the circuit board opposite the front side of the circuit board.

10. The apparatus of claim 9, wherein the set of layers further includes a layer of conductive adhesive positioned between the foil layer and the outer layer and wherein the layer of conductive adhesive includes tabs extending outward from a central body to cover each of the tabs of the foil layer on the back side of the circuit board.

11. The apparatus of claim 10, wherein the set of layers further comprises a pair of non-conductive adhesive layers and wherein the foil layer and the layer of conductive adhesive are sandwiched between the pair of non-conductive adhesive layers.

12. An apparatus for providing electromagnetic interference (EMI) containment at an opening in a computer enclosure, comprising:
   a circuit board; and
   a membrane covering a first side of the circuit board, the membrane comprising:
      an inner layer formed of a non-conductive adhesive abutting the front side of the circuit board,
      an outer layer with a first side facing away from the circuit board and a second side facing toward the circuit board,
      a foil layer positioned between the inner layer and the outer layer and comprising a body formed of a metal foil, and
      a layer of conductive adhesive positioned between the foil layer and the outer layer,
      wherein the body of the foil layer extends over the first side of the circuit board, wherein the foil layer further comprises tabs extending outward from sides of the body and wherein each of the tabs extends over an edge of the circuit board and abuts a portion of a second side of the circuit board opposite the first side of the circuit board, and wherein the layer of conductive adhesive includes tabs extending outward from a central body to cover each of the tabs of the foil layer on the second side of the circuit board.

13. The apparatus of claim 12, wherein the metal foil comprises aluminum foil.

14. The apparatus of claim 12, wherein the set of layers further comprises a pair of non-conductive adhesive layers and wherein the foil layer and the layer of conductive adhesive are sandwiched between the pair of non-conductive adhesive layers.

15. The apparatus of claim 12, wherein the membrane further includes a mechanical switch abutting the second side of the outer layer and extending through a switch passageway provided through the inner layer, the foil layer, and the layer of conductive adhesive to contact a button on the front side of the circuit board when the mechanical switch is actuated.

16. The apparatus of claim 12, wherein openings are provided in the inner layer, the foil layer, and the layer of conductive adhesive to define a plurality of light passageways, wherein the first side of the outer layer comprises a plurality of domed lens elements each aligned with one of the light passageways, and wherein the circuit board comprises a light source on the front side aligned with each of the light passageways, whereby light from each light source is passed through the plurality of layers via the light passageways and is diffused at a viewing angle of at least 30 degrees by one of the domed lens elements.

17. An apparatus for mounting over an opening in an electronics enclosure to provide electromagnetic interference (EMI) containment and other functions, comprising:
   a circuit board with a function-triggering button on a front side; and
   a membrane attached to and covering the front side of the circuit board comprising a plurality of layers including an inner layer formed of an adhesive material abutting the front side of the circuit board and an outer layer formed of a clear material with a first side facing away from the circuit board and a second side facing toward the circuit board,
   wherein the plurality of layers includes a foil layer positioned between the inner layer and the outer layer that comprises a body formed of a metal foil,
   wherein the membrane further includes a linear-actuated switch abutting the second side of the outer layer and extending through a switch passageway provided through the inner layer and the foil layer, whereby the function-triggering button is activated when the linear-actuated switch is moved linearly through a predefined amount of travel,
   wherein openings are provided in the inner layer and the foil layer to define a plurality of light passageways,
   wherein the first side of the outer layer comprises a plurality of domed lens elements each aligned with one of the light passageways, and
   wherein the circuit board comprises a light source on the front side aligned with each of the light passageways, whereby light from each light source is passed through the plurality of layers via the light passageways and is diffused at a viewing angle of at least 30 degrees by one of the domed lens elements.

18. The apparatus of claim 17, wherein the metal foil comprises aluminum foil and wherein the body of the foil layer extends over the front side of the circuit board.

19. The apparatus of claim 18, wherein the foil layer further comprises four tabs extending outward from sides of the body, wherein each of the tabs extends over an edge of the circuit board and abuts a portion of a back side of the circuit board opposite the front side of the circuit board, wherein the plurality of layers further includes a layer of conductive adhesive positioned between the foil layer and the outer layer, wherein the layer of conductive adhesive includes a hole aligned with the switch passageway to allow the linear-actuated switch to pass through the layer of conductive adhesive, and wherein the layer of conductive adhesive includes four tabs extending outward from a central body to cover each of the tabs of the foil layer on the back side of the circuit board.

20. The apparatus of claim 17, wherein the first side of the outer layer of the membrane includes a domed switch element extending outward from the circuit board a distance and with a center aligned with a center of the linearly-actuated switch and wherein the plurality of layers have a thickness when combined with the distance that matches the predefined amount of travel.

21. The apparatus of claim 20, wherein the linearly-actuated switch comprises a dome switch.

22. An apparatus for providing electromagnetic interference (EMI) containment and other functionality, comprising:
   a circuit board with light sources on a front side; and
   a membrane covering the front side of the circuit board comprising a set of layers including an inner layer formed of a non-conductive adhesive abutting the front side of the circuit board,
   wherein the set of layers further includes an outer layer with a first side facing away from the circuit board and a second side facing toward the circuit board,
   wherein the set of layers includes a foil layer positioned between the inner layer and the outer layer and comprising a body formed of a metal foil,
   wherein holes are provided in the inner layer and the foil layer defining a plurality of light passageways each aligned with one of the light sources,
   wherein the metal foil comprises aluminum foil,
   wherein the body of the foil layer extends over the front side of the circuit board, wherein the foil layer further comprises tabs extending outward from sides of the body, and wherein each of the tabs extends over an edge of the circuit board and abuts a portion of a back side of the circuit board opposite the front side of the circuit board.

23. The apparatus of claim 22, wherein the first side of the outer layer comprises a plurality of domed lens elements each aligned with one of the light passageways, wherein light emitted from each light source is passed through the set of layers via the light passageways and is diffused at a viewing angle of at least 30 degrees by one of the domed lens elements, wherein the set of layers of the membrane further comprises a diffuser layer disposed between the inner layer and the foil layer, and wherein the diffuser layer comprises a body formed of a translucent plastic extending through the light passageways.

24. The apparatus of claim 22, wherein the set of layers further includes a layer of conductive adhesive positioned between the foil layer and the outer layer and wherein the layer of conductive adhesive includes tabs extending outward from a central body to cover each of the tabs of the foil layer on the back side of the circuit board.

25. The apparatus of claim 24, wherein the set of layers further comprises a pair of non-conductive adhesive layers and wherein the foil layer and the layer of conductive adhesive are sandwiched between the pair of non-conductive adhesive layers.

* * * * *